United States Patent
Schenk

(10) Patent No.: US 11,605,435 B2
(45) Date of Patent: Mar. 14, 2023

(54) THRESHOLD SWITCH STRUCTURE AND MEMORY CELL ARRANGEMENT

(71) Applicant: Ferroelectric Memory GmbH, Dresden (DE)

(72) Inventor: Tony Schenk, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 10 days.

(21) Appl. No.: 17/379,168

(22) Filed: Jul. 19, 2021

(65) Prior Publication Data
US 2022/0172791 A1     Jun. 2, 2022

(30) Foreign Application Priority Data

Jun. 16, 2021   (DE) .................... 10 2021 115 613.0

(51) Int. Cl.
  *G11C 16/34*     (2006.01)
  *G11C 16/04*     (2006.01)
  *G11C 16/26*     (2006.01)

(52) U.S. Cl.
  CPC ............ *G11C 16/34* (2013.01); *G11C 16/04* (2013.01); *G11C 16/26* (2013.01)

(58) Field of Classification Search
  CPC ......... G11C 16/34; G11C 16/04; G11C 16/26; G11C 11/22; G11C 2213/54;
  (Continued)

(56) References Cited

U.S. PATENT DOCUMENTS

2020/0065647 A1\* 2/2020 Mulaosmanovic .... G06N 3/084
2021/0118502 A1\* 4/2021 Janjua ................ G11C 13/0004
(Continued)

OTHER PUBLICATIONS

Eike Linn et al. Nature Materials, vol. 9, "Complementary resistive switches for passive nanocrossbar memories" dated May 2010, pp. 1-4. Milan Pesic, et al., Advanced Functional Materials, Supporting Information, "Nonvolatile Random Access Memory and Energy Storage Based on Antiferroelectric Like Hysteresis in Zr02", Copyright W11 Ey-Vch Verlag GmbH & Co. KGaA, 69469 Weinheim, Germany, 2013, pp. 1-6 Milan Pesic, et al., Advanced Functional Materials, Materials Views, "Nonvolatile Random Access Memory and Energy Storage Based on Antiferroelectric Like Hysteresis in Zr02", © 2016 W11 Ey-Vch Verlag GmbH & Co. KGaA, Weinheim Germany, Adv. Funct. Mater. 2016, 26, 7486-7494, pp. 1-9 Geanina Apachitei et al., Advanced Electronic Materials, "Antiferroelectric Tunnel Junctions", © 2017 WTTEY-VCH Verlag GmbH & Co. KGaA, Weinheim, pp. 1-5 Youngin Goh et al., Appled Materials & Interfaces, Research Article "Excellent Reliability and High-Speed Antiferroelectric HfZr02 Tunnel Junction by a High-Pressure Annealing Process and Built-In Bias Engineering", https://dx.doi.org/10.1021/acsami.0c15091, pp. 1-8.

(Continued)

*Primary Examiner* — Huan Hoang
*Assistant Examiner* — Minh Dinh
(74) *Attorney, Agent, or Firm* — Hickman Becker Bingham Ledesma LLP; Malgorzata A. Kulczycka

(57) ABSTRACT

Various aspects relate to a threshold switch structure and a use of such threshold switch structure as a threshold switch in a memory cell arrangement, the threshold switch structure including: a first electrode, a second electrode, a switch element in direct physical contact with the first electrode and the second electrode, the switch element including a layer of a spontaneously polarizable material. The first electrode, the second electrode, and the switch element are configured to allow for a switching of the switch element between a first electrical conductance state and a second electrical conductance state as a function of a voltage drop provided over the switch element by the first electrode and the second electrode.

21 Claims, 8 Drawing Sheets

(58) Field of Classification Search
CPC ............ G11C 11/1659; G11C 13/0004; G11C 13/0011; G11C 13/003; G11C 2213/76; H01L 45/04
USPC .................................................... 365/185.24
See application file for complete search history.

(56) References Cited

U.S. PATENT DOCUMENTS

2021/0313397 A1* 10/2021 Lee ....................... H01L 27/249
2022/0190239 A1*  6/2022 Ando ................. G11C 13/0069

OTHER PUBLICATIONS

Milan Pešić, et al., Advanced Functional Materials, Supporting Information, "Nonvolatile Random Access Memory and Energy Storage Based on Antiferroelectric Like Hysteresis in ZrO2", Copyright Wiley-VCH Verlag GmbH & Co. KGaA, 69469 Weinheim, Germany, 2013, pp. 1-6.

Milan Pešić, et al., Advanced Functional Materials, Materials Views, "Nonvolatile Random Access Memory and Energy Storage Based on Antiferroelectric Like Hysteresis in ZrO2", © 2016 Wiley-VCH Verlag GmbH & Co. KGaA, Weinheim Germany, Adv. Funct. Mater. 2016, 26, 7486-7494, pp. 1-9.

Geanina Apachitei et al., Advanced Electronic Materials, "Antiferroelectric Tunnel Junctions", © 2017 Wiley-VCH Verlag GmbH & Co. KGaA, Weinheim, pp. 1-5.

Youngin Goh et al., Appled Materials & Interfaces, Research Article "Excellent Reliability and High-Speed Antiferroelectric HfZrO2 Tunnel Junction by a High-Pressure Annealing Process and Built-In Bias Engineering", https://dx.doi.org/10.1021/acsami.0c15091, pp. 1-8.

* cited by examiner

THRESHOLD SWITCH STRUCTURE AND MEMORY CELL ARRANGEMENT

PRIORITY

This application claims priority to German patent application serial number 10 2021 115 613.0 filed Jun. 16, 2021, which is incorporated herein by reference in its entirety.

TECHNICAL FIELD

Various aspects relate to an electronic device or at least a part of an electronic device, e.g., a capacitive/tunnel switch structure, a voltage controlled switch, a threshold switch, and a memory cell arrangement including a capacitive/tunnel switch structure, a voltage controlled switch, or a threshold switch.

BACKGROUND

In general, various electronic devices have been developed. Usually, e.g., in the semiconductor industry, one or more electronic devices, as for example one or more memory cells, one or more sensors, one or more transmitters, one or more receivers, and the like, may be formed by so called semiconductor processes, e.g., layering processes, patterning, processes, annealing processes, and doping processes. Various electronic devices may include functional materials, e.g., ferroelectric materials, antiferroelectric materials, ferromagnetic materials, antiferromagnetic materials, piezoelectric materials, pyroelectric materials, only as examples, in form of one or more functional layers integrated solely and/or in combination with one or more other layers, e.g., electrode layers, semiconductor layers, protection layers, barrier layers, as examples. Various types of switches may be provided in the semiconductor industry. However, most of the switches that may be used to control functions of electronic devices may be of a transistor type, e.g., a field-effect transistor, that allows for low leakage currents during their off-time.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
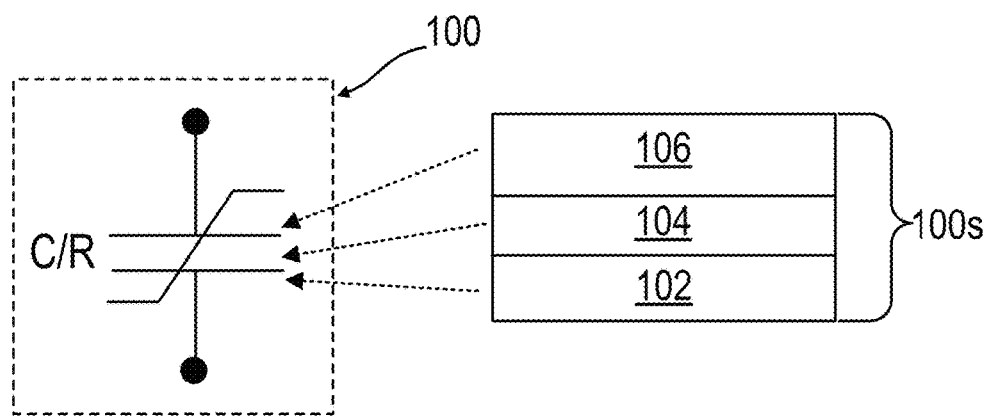
FIG. 1 shows schematically a memory structure, according to various aspects.

The following detailed description refers to the accompanying drawings that show, by way of illustration, specific details, and aspects in which the invention may be practiced. These aspects are described in sufficient detail to enable those skilled in the art to practice the invention. Other aspects may be utilized, and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

In the semiconductor industry, the integration of non-volatile memory technologies, sensor technologies, transmitter technologies, electronic filter technologies, receiver technologies, and the like may be useful for various types of devices and applications. According to various aspects, an electronic device, e.g., a non-volatile memory may be integrated on a chip together with a processor core of a processor. As another example, one or more non-volatile memories may be used as part of a mass storage device. As still another example, one or more sensors may be used as part of a sensor device. As still another example, one or more transmitters and/or receivers may be used as part of a communication device.

Various aspects may be related to forming and/or influencing one or more functions of an electronic device by a switch structure, e.g., by a voltage controlled two-terminal switch that is configured to switch from a substantially non-conductive (off-) state into a substantially conductive (on-) state in the case that a voltage drop over the two-terminals of the switch is in a predefined voltage range. An example may include an anti-ferroelectric junction switch that includes at least an anti-ferroelectric layer disposed between at least two electrode layers in an asymmetric configuration. In some aspects, the at least two electrode layers may have an asymmetric configuration. The asymmetric configuration with respect to the at least two electrode layers may include that the at least two electrode layers are formed of distinct materials. Another option may include that the at least two electrode layers are formed of the same material but that the electrodes have different characteristics due to, for example, different textures, different grain sizes, different interface oxidation, different interface trap states, as examples. In general, an electronic asymmetric configuration may be realized by influencing or defining electronic properties such as band structures, energy levels, trap levels, Fermi levels, since such properties may be a function of a material, a microstructure, defects, doping, stress, as examples. In some aspects, one or more dielectric layers may be disposed between the at least two electrode layers, wherein the arrangement of the anti-ferroelectric layer and the one or more dielectric layers may be spatially asymmetric, e.g., one electrode layer of the at least two electrode layers may be in direct physical contact with the anti-ferroelectric layer and another electrode layer of the at least two electrode layers may be in direct physical contact with one of the one or more dielectric layers. In some aspects, the two electrode layers may include distinct materials to provide the desired asymmetry.

According to various aspects, a functional layer of the switch structure may include or may be made of a spontaneously polarizable (e.g., an anti-ferroelectric) material. An anti-ferroelectric material may show a hysteresis in the (voltage dependent) polarization, however, with no or no substantial remanent polarization remaining in the case that no voltage drops over the anti-ferroelectric material. A polarization capability of a material (dielectric, spontaneous and remanent polarization) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a material may include transmission electron microscopy, e.g., an electric-field dependent transmission electron microscopy. According to various aspects, in various types of applications, e.g., in memory technology or threshold switch technology, a remanent polarization as low as 0 µC/cm$^2$ to 3 µC/cm$^2$ may be regarded as no substantial remanent polarization. Such low values of a remanent polarization may be present in a layer due to undesired effects, e.g., due to a not ideal layer formation.

FIG. 1 shows a schematic functioning of a memory structure 100, according to various aspects. In some aspects, the memory structure 100 may include one or more electrodes 102, 106 (e.g., one or more electrode layers) and a memory element 104 coupled to the one or more electrodes 102, 106. The memory element 104 may include or may be a memory layer disposed between two electrode layers. The memory element 104 may include or may consist of any type of suitable memory material, as for example: a spontaneously polarizable material (e.g., a remanent polarizable material, e.g., a ferroelectric or antiferroelectric material), resistive memory material, a memory material that causes tunnel electro-resistance effects, a memory material that causes magneto resistive effects, phase-change memory material, valence-change memory material, and/or electro-chemical migration memory material. The memory structure 100 may have a capacitance, C, and/or a resistance, R, associated therewith. The one or more electrodes 102, 106 (e.g., the two electrodes 102, 106 in a capacitor arrangement) and the memory element 104 may form a memory layer stack 100s. In some aspects, the memory layer stack of 100s may be a planar layer stack; however, other shapes may be suitable as well, e.g., curved shapes, angled shapes, coaxially aligned shapes, as examples.

In some aspects, the memory structure 100 itself may be used as a memory cell 100 in a memory cell arrangement. In other aspects, the memory structure 100 may be coupled to or integrated in another device, e.g., a field-effect transistor, and the combination of the memory structure 100 and the other device may be used as a memory cell in a memory cell arrangement. According to various aspects, a memory element 104 may include one or more memory layers.

Figure 2:
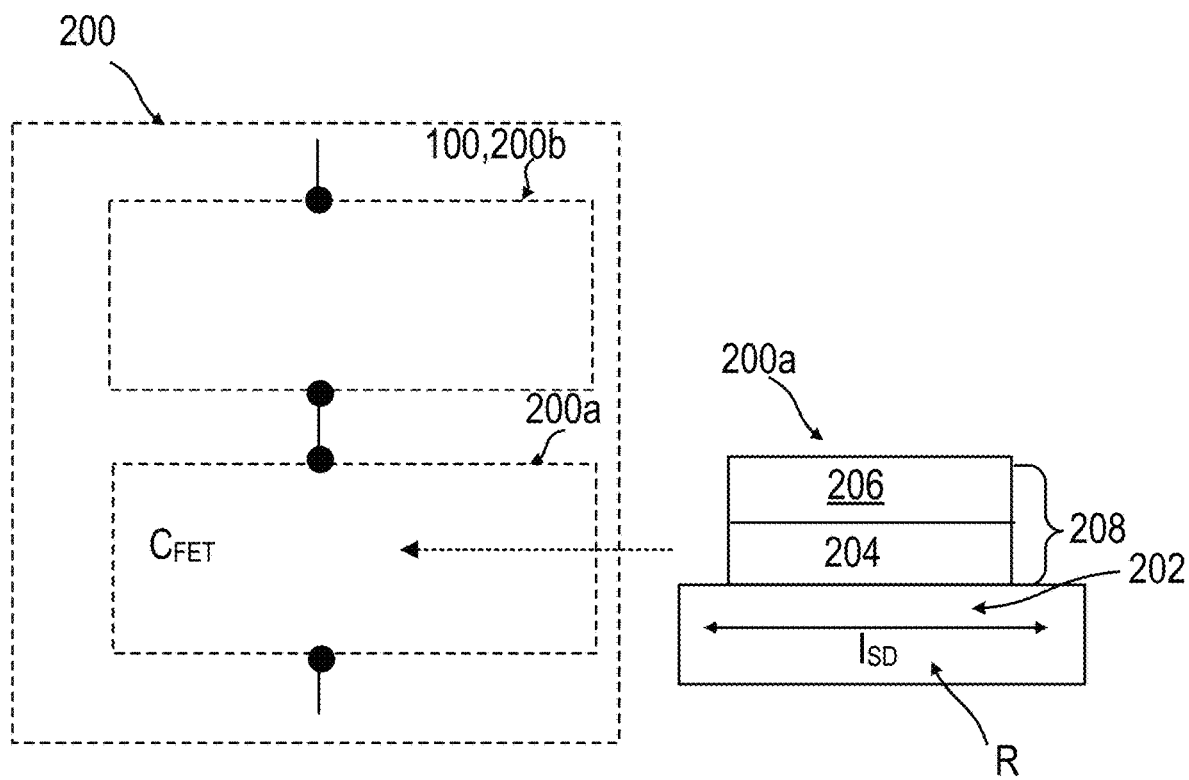
FIG. 2 shows schematically an equivalent circuit diagram of a memory cell including a memory structure, according to various aspects.

FIG. 2 shows a circuit equivalent of a memory cell 200 including a field-effect transistor structure 200a and a memory structure 200b, according to various aspects. According to various aspects, the memory structure 200b may be configured as described with reference to the memory structure 100 illustrated in FIG. 1, e.g., including one or more electrodes 102, 106 and a memory element 104 coupled to the one or more electrodes 102, 106. In other aspects, the memory structure 200b may be integrated within a gate stack 208 of the field-effect transistor structure 200a. In still other aspects, the memory structure 200b may be coupled to the source or drain of the field-effect transistor structure 200a. The field-effect transistor structure 200a may include a gate structure 208, wherein the gate structure 208 may include a gate isolation 204 and a gate electrode 206. The gate structure 208 is illustrated exemplarily as a planar gate stack; however, it may be understood that the planar configuration shown in FIG. 2 is an example, and other field-effect transistor designs may include a gate structure 208 with a non-planar shape, for example a trench gate transistor design, a vertical field-effect transistor design, or other designs, such as a fin-FET design. The gate structure 208 may define a channel region 202, e.g., provided in a semiconductor portion (e.g., in a semiconductor layer, in a semiconductor die, etc.). The gate structure 208 may allow for a control of an electrical behavior (e.g., a resistance R) of the channel region 202, e.g., a current flow in the channel region 202 may be controlled (e.g., allowed, increased, prevented, decreased, etc.). In some aspects, the gate structure 208 may, for example, allow to control (e.g., allow or prevent) a source/drain current, $I_{SD}$, from a first source/drain region of the field-effect transistor structure 200a to a second source/drain region of the field-effect transistor structure 200a (the source/drains are provided in or adjacent to the channel but are not shown in FIG. 2). The channel region 202 and the source/drain regions may be formed, e.g., via doping one or more semiconductor materials or by the use of intrinsically doped semiconductor materials, within a layer and/or over a layer. With respect to the operation of the field-effect transistor structure 200a, a voltage may be provided at the gate electrode 206 to control the current flow, $I_{SD}$, in the channel region 202, the current flow, $I_{SD}$, in the channel region 102 being caused by voltages supplied via the source/drain regions. The gate electrode 206 may include an electrically conductive material. According to various aspects, the gate isolation 204 may be configured to provide an electrical separation of the gate electrode 206 from the channel region 202 and further to influence the channel region 202 via an electric field generated by the gate electrode 206. The gate isolation 204 may include one or more electrically insulating layers, as an example.

Figure 3A:
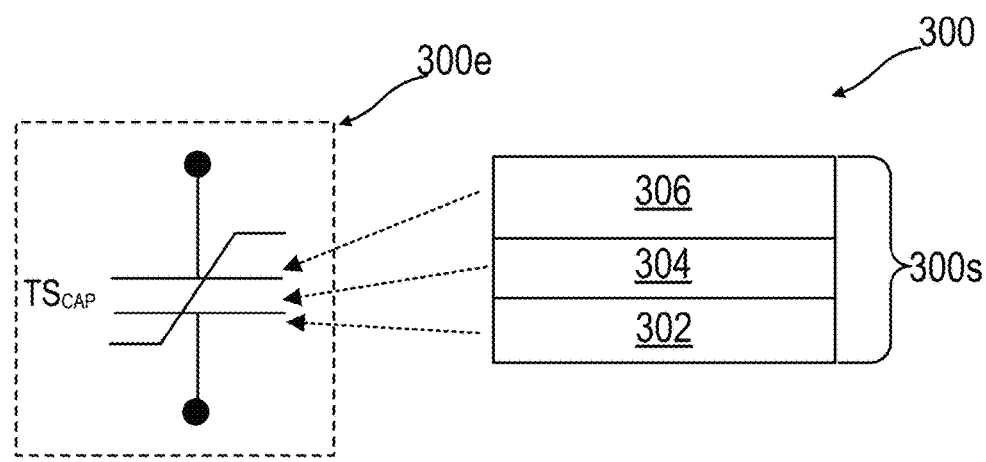
FIG. 3A shows schematically a threshold switch structure and a corresponding equivalent circuit diagram, according to various aspects.

FIG. 3A shows schematically a threshold switch structure 300 and a corresponding equivalent circuit diagram 300e, according to various aspects. The threshold switch structure 300 may be integrated in a memory array (see memory cell arrangement 600, 700 in FIGS. 6 and 7) as a threshold switch to selectively separate or connect one or more memory cells from or to one or more control lines in a voltage dependent manner.

According to various aspects, the threshold switch structure 300 may include a first electrode 302, a second electrode 306, and a switch element 304 disposed between the first electrode 302 and the second electrode 306. The switch element 304 may form together with the first electrode 302 and the second electrode 306 a capacitive switch structure, as exemplarily shown in the equivalent circuit diagram 300e. The threshold switch structure 300 may be regarded as a capacitive structure; however, the switch element 304, the first electrode 302, and the second electrode 306 are configured to allow for a substantial current flow from the first electrode 302 to the second electrode 306 through the switch element 304 and/or from the second electrode 306 to the first electrode 302 through the switch element 304, see FIG. 3B, under certain voltage conditions.

According to various aspects, the switch element 304 may be in direct physical contact with both the first electrode 302 and the second electrode 306. According to various aspects, the switch element 304 may include at least a layer of a polarizable material, e.g., a spontaneously polarizable material such as an anti-ferroelectric material. The switch element 304 may be, however, substantially free of a remanently polarizable material (e.g., the switch element 304 may have residual polarization of less than 3 $\mu C/cm^2$), e.g., substantially free of a ferroelectric material, such that it can be assured, in some aspects, that the threshold switch structure 300 is in an off-state in the case that no substantial voltage drops over the switch element 304.

According to various aspects, the first electrode 302, the second electrode 306, and the switch element 304 may be configured to allow for a switching of the switch element 304 between a first electrical conductance state and a second electrical conductance state as a function of a voltage drop provided over the switch element 304 by the first electrode 302 and the second electrode 306. In other words, the switch element 304 can be switched from a first electrical conductance state into a second electrical conductance state as a function of a voltage drop provided over the switch element 304 by the first electrode 302 and the second electrode 306 and the switch element 304 can be switched from the second electrical conductance state into the first electrical conductance state as a function of a voltage drop provided over the switch element 304 by the first electrode 302 and the second electrode 306.

According to various aspects, the threshold switch structure 300 may include only a switch layer stack 300s including the first electrode 302, the second electrode 306, and the switch element 304. The first electrode 302 and/or the second electrode 306 may include respectively various sublayers of different electrically conductive materials; however, the various sublayers may have only the function of providing the respective electrode. The switch element 304 may include various sublayers of different materials (e.g., as shown in FIG. 4B to FIG. 4D); however, the various sublayers may have only the function of providing the switch element 304. In some aspects, the switch layer stack 300s may be a planar layer stack; however, other shapes may be suitable as well, e.g., curved shapes, angled shapes, coaxially aligned shapes, as examples. Such other shapes may allow, for example, a reduction of the footprint of the threshold switch structure 300 on a substrate, e.g., on a wafer.

Figure 3B:
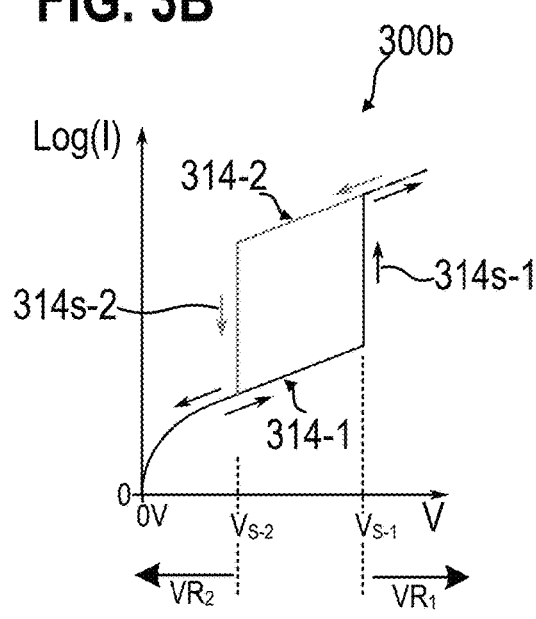
FIG. 3B and FIG. 3C show schematically an electrical conductance behavior and a polarization behavior of a threshold switch structure, according to various aspects.
Figure 3C:
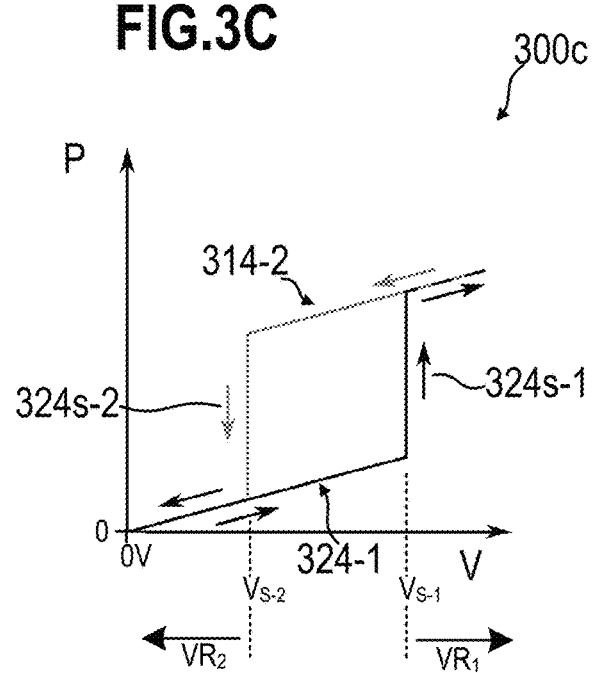

FIG. 3B shows a current/voltage characteristic 300b of the switch element 304 and therefore of the threshold switch structure 300 in an exemplary graph, according to various aspects. In accordance with the current/voltage characteristic 300b, FIG. 3C shows a polarization/voltage characteristic 300c of the switch element 304 and therefore of the threshold switch structure 300 in an exemplary graph, according to various aspects.

The current/voltage characteristic 300b is illustrated in FIG. 3B with a logarithmic current (log(I)) that flows through the switch element 304 plotted on the vertical axis and a voltage (V) that drops over the switch element 304 plotted on the horizontal axis. According to various aspects, the switch element 304 may switch 314s-1, 314s-2 from a first electrical conductance state 314-1 into a second electrical conductance state 314-2 and vice versa as a function of the voltage (V) that drops over the switch element 304. In more detail, in the case that a voltage drop (V) over the switch element 304 changes (e.g., raises from zero volts) into a first predefined voltage range $VR_1$, e.g., to a voltage equal to or greater than a first threshold voltage value $V_{S-1}$, the switch element 304 may switch 314s-1 from the first electrical conductance state 314-1 into the second electrical conductance state 314-2. According to various aspects, in the case that switch element 304 is in the second electrical conductance state 314-2 and the voltage drop (V) over the switch element 304 changes (e.g., falls from a voltage greater than $V_{S-1}$) into a second predefined voltage range $VR_2$, e.g., equal to or less than a second threshold voltage value $V_{S-2}$, the switch element 304 may switch back 314s-2 from the second electrical conductance state 314-2 into the first electrical conductance state 314-1. According to various aspects, starting from a voltage drop (v) less than the first threshold voltage value $V_{S-1}$ (e.g., from zero volts, for example), the switch element 304 may remain in the first electrical conductance state 314-1 as long as the voltage drop is less than the first threshold voltage value $V_{S-1}$. Starting from a voltage drop (v) greater than the first threshold voltage value $V_{S-1}$, the switch element 304 may remain in the second electrical conductance state 314-2 as long as the voltage drop is greater than the second threshold voltage value $V_{S-2}$. The first threshold voltage value $V_{S-1}$ for the voltage (V) that drops over the switch element 304 may be referred to herein as first threshold voltage drop and the second threshold voltage value $V_{S-2}$ for the voltage (V) that drops over the switch element 304 may be referred to herein as second threshold voltage drop.

According to various aspects, the first electrical conductance state 314-1 may be a low conductance and a high resistance state, therefore a lower current or substantially no current may flow through the switch element 304, and the second electrical conductance state 314-2 may be a high conductance and a low resistance state, therefore a high current (e.g., one or more orders of magnitude higher than the current in the first electrical conductance state 314-1) may flow through the switch element 304.

It is noted that the current/voltage characteristic of the switch element 304 (and therefore of the threshold switch structure 300) may show a hysteresis (see the difference between the black and the grey graph), since the current/voltage characteristic is linked to a polarization/voltage characteristic of the switch element 304 (and therefore of the threshold switch structure 300). According to various aspects, the first electrical conductance state 314-1 may correspond to a first polarization state 324-1 of the anti-ferroelectric material of the switch element 304 and the second electrical conductance state 314-2 may correspond to a second polarization state 324-2 of the anti-ferroelectric material of the switch element 304, as shown exemplarily in FIG. 3C.

The polarization/voltage characteristic 300c in FIG. 3C is illustrated with the polarization (P) of the switch element 304 plotted on the vertical axis and the voltage (V) that drops over the switch element 304 plotted on the horizontal axis. According to various aspects, the switch element 304 may switch 324s-1, 324s-2 from a first polarization state 324-1 into a second polarization state 324-2 and vice versa as a function of the voltage (V) that drops over the switch element 304. In more detail, in the case that a voltage drop (V) over the switch element 304 changes (e.g., raises from zero volts) into a first predefined voltage range $VR_1$, e.g., to a voltage equal to or greater than a first threshold voltage value $V_{S-1}$, the switch element 304 may switch 324s-1 from the first polarization state 324-1 into the second polarization state 324-2. According to various aspects, in the case that switch element 304 is in the second polarization state 324-2 and the voltage drop (V) over the switch element 304 changes (e.g., falls from a voltage greater than $V_{S-1}$) into a second predefined voltage range $VR_2$, e.g., equal to or less than a second threshold voltage value $V_{S-2}$, the switch element 304 may switch back 324s-2 from the second polarization state 324-2 into the first polarization state 324-1. According to various aspects, starting from a voltage drop (V) less than the first threshold voltage value $V_{S-1}$ (e.g., from zero volts, for example), the switch element 304 may remain in the first polarization state 324-1 as long as the voltage drop is less than the first threshold voltage value $V_{S-1}$. Starting from a voltage drop (V) greater than the first threshold voltage value $V_{S-1}$, the switch element 304 may remain in the second polarization state 324-2 as long as the voltage drop is greater than the second threshold voltage value $V_{S-2}$.

According to various aspects, the first polarization state 324-1 may be a low polarization state or a non-polarized state, therefore a lower current or substantially no current may flow through the switch element 304, and the second polarization state 324-2 may be a high polarization state or a polarized state, therefore a high current (e.g., one or more orders of magnitude higher than the current in the first polarization state 324-1) may flow through the switch element 304.

It is noted that the polarization/voltage characteristic of the switch element 304 (and therefore of the threshold switch structure 300) may show a hysteresis (see the difference between the black and the grey graph), since the polarization characteristic of the switch element 304 (and therefore of the threshold switch structure 300) may be defined by the layer of the anti-ferroelectric material included in the switch element 304. The switching characteristic of the threshold switch structure 300 may be defined by the non-linearity in the polarization/voltage characteristic of the switch element 304 caused by the anti-ferroelectric material.

In the case that the threshold switch structure 300 is used in a memory cell arrangement to protect one or more memory cells from consequences of undesired voltage drops, the threshold switch structure 300 may be configured such that switch element 304 is in the first electrical conductance state 314-1 (and therefore in the first polarization state 324-1) in the case that the voltage drop (V) is zero (0 V), independently from a previous electrical conductance state the switch element was residing in. In other words, the layer of the anti-ferroelectric material of the switch element 304 may have substantially no residual polarization (P=0) in the case that the voltage drop (V) is zero (0 V), independently from a previous electrical conductance state the switch element was residing in. In some aspects, the threshold switch structure 300 may prevent a current flow within a part of a memory cell arrangement. As an example, a disturb voltage may not affect a memory cell in the memory cell arrangement since the threshold switch structure 300 may be configured to prevent a current flow through the memory cell as long as the disturb voltage is lower than the threshold voltage of the threshold switch structure 300.

Figure 4A:
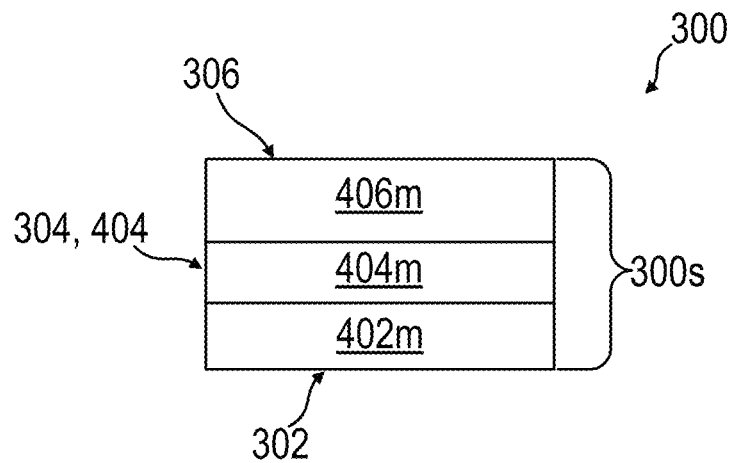
FIG. 4A and FIG. 4B show schematically various aspects of threshold switch structure, according to various aspects.
Figure 4A:
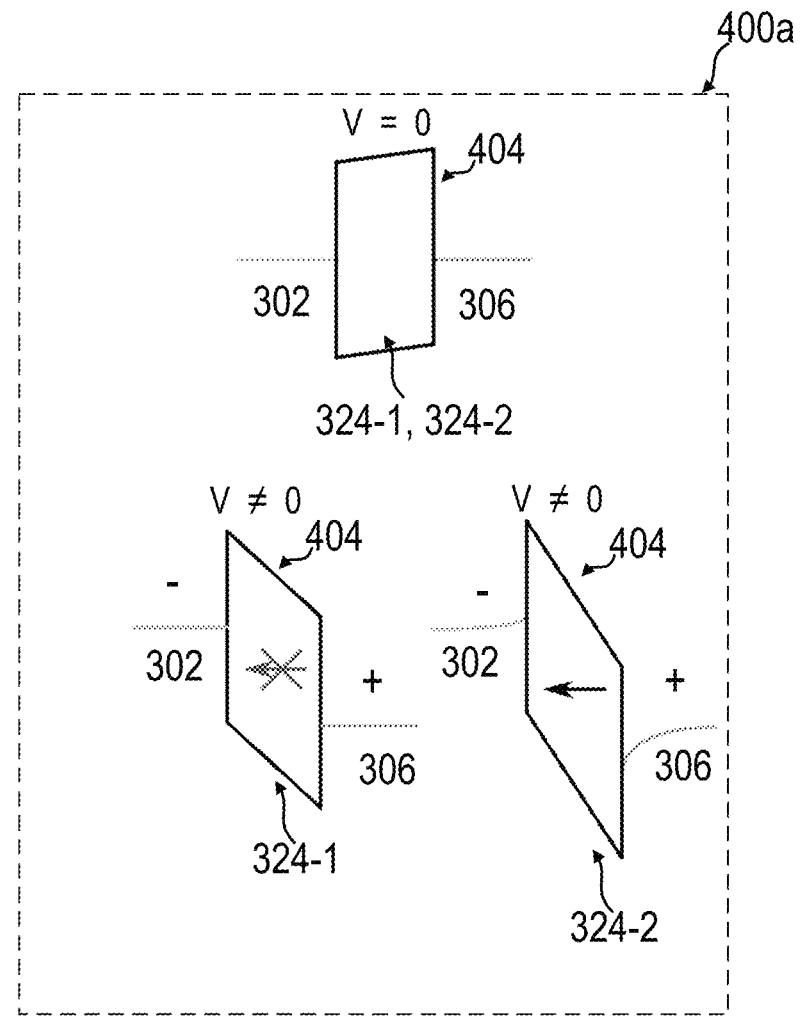
Figure 4B:
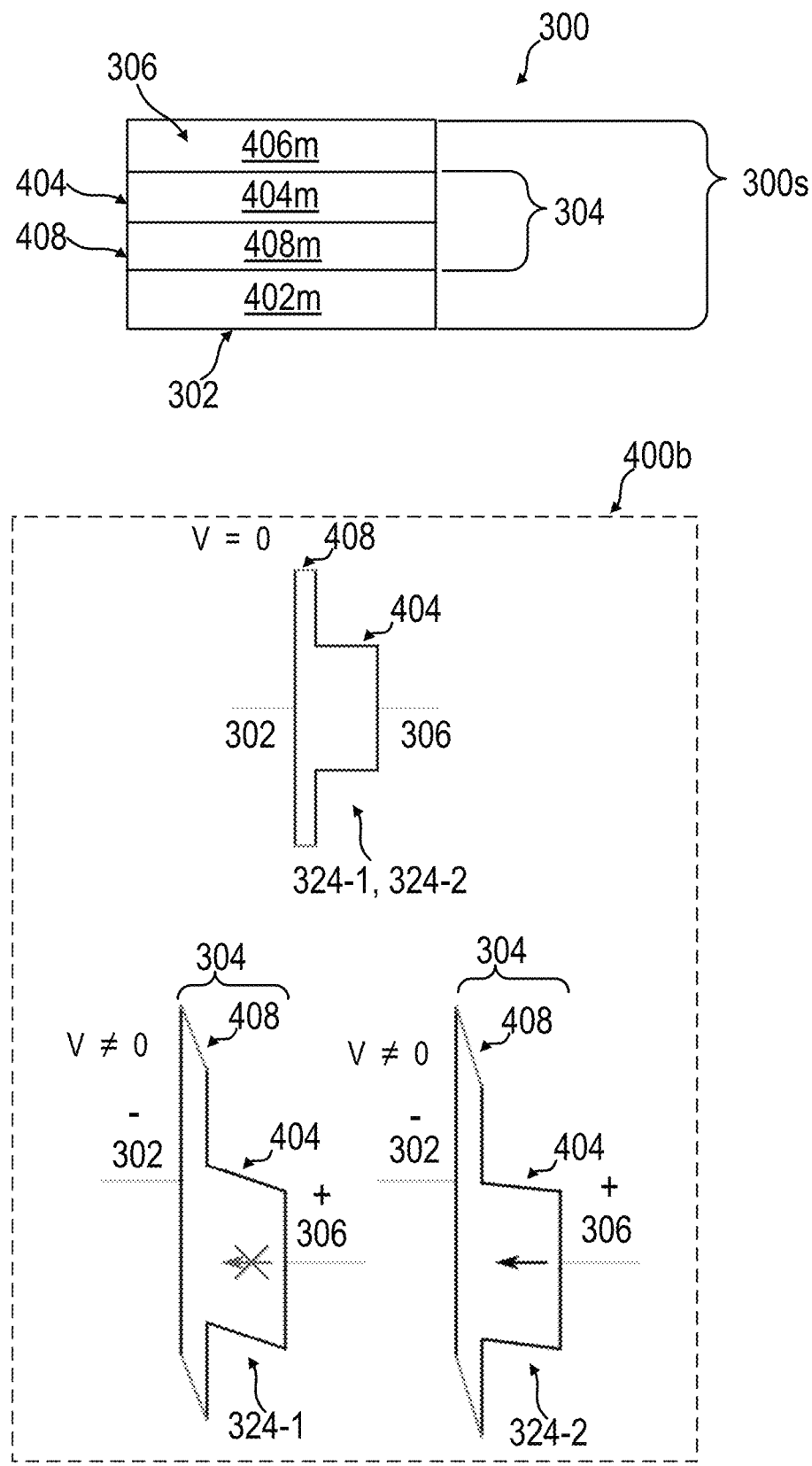

FIG. 4A and FIG. 4B show various aspects of different configurations with respect to the switch element 304 of the threshold switch structure 300. According to various aspects, the switch element 304 may substantially consist of anti-ferroelectric material, e.g., in form of a layer (referred to herein as anti-ferroelectric layer 404).

As illustrated in FIG. 4A, the anti-ferroelectric layer 404 of the threshold switch structure 300 may be in direct physical contact with both the first electrode 302 and the second electrode 304. In this case, the first electrode 302 may include a first electrically conductive material 402m and the second electrode 306 may include a second electrically conductive material 406m different from the first electrically conductive material 402m. In some aspects, the use of different electrically conductive materials for the electrodes 302, 306 of the threshold switch structure 300 may be necessary to induce the desired switching behavior. The first electrically conductive material 402m may be a first metal and the second electrically conductive material may be a second metal 406m. However, instead of a metal a doped semiconductor or other conductive materials may be used. According to various aspects, the first electrically conductive material 402m may have a first Debye length and the second electrically conductive material 406m may have a second Debye length different from the first Debye length. In some aspects, the use of materials having different Debye lengths for the electrodes 302, 306 of the threshold switch structure 300 may be necessary to induce the desired switching behavior.

FIG. 4A further illustrates schematic band diagrams 400a for different states of the threshold switch structure 300. In more detail, the electric characteristic of the threshold switch structure 300 can be influenced by providing a voltage different (V≠0) over the switch element 304 (including the anti-ferroelectric layer 404) by the first electrode 302 and the second electrode 306. Due to the polarization of the anti-ferroelectric material 404m of the switch element 304, the Fermi levels of the first electrode 302 and the second electrode 306 and the bandgap caused by the switch element 304 are different for the two different polarization states 324-1, 324-2. As a result, in the first electrical conductance state 314-1, the switch element 304 and therefore the threshold switch structure 300 has a lower electrical conductivity and a higher electrical resistance compared to the second electrical conductance state 314-2.

As illustrated in FIG. 4B, the anti-ferroelectric layer 404 of the threshold switch structure 300 may be in direct physical contact with only one of the first electrode 302 and the second electrode 304, in this exemplary case with the second electrode 306. According to various aspects, the switch element 300 may further include a dielectric layer 408. The dielectric layer 408 may be disposed between the first electrode 302 and the second electrode 304, e.g., between the first electrode 302 and the anti-ferroelectric layer 404. In some aspects, the dielectric layer 408 may be in direct physical contact with both the layer of the anti-ferroelectric material 404m (e.g., the anti-ferroelectric layer 404) and another one of the first electrode 302 and the second electrode 304, in this exemplary case with the first electrode 302.

According to various aspects, the dielectric layer 408 may include (e.g., may consist of) a dielectric material 408m that has a greater bandgap than the anti-ferroelectric material 404m of the anti-ferroelectric layer 404, see the schematic band diagrams 400b of FIG. 4B. According to various aspects, the dielectric material 408m may include an oxide, a nitride, and/or an oxynitride, e.g., a metal oxide, a metal nitride, and/or a metal oxynitride. According to various aspects, the dielectric material 408m may include a material that exhibits neither ferroelectric polarization properties nor anti-ferroelectric polarization properties. The dielectric material 408m may include silicon oxide, hafnium oxide, zirconium oxide, as examples. In the case that the switch element 304 includes at least one dielectric layer 408, as shown, for example, in FIG. 4B, the materials 402m, 406m of the electrodes 302, 306 may be selected as desired, e.g., the same material may be used to provide the electrodes 302, 306 of the threshold switch structure 300 or distinct materials may be used to provide the electrodes 302, 306 of the threshold switch structure 300.

FIG. 4B further illustrates schematic band diagrams 400b for different states of the threshold switch structure 300. In more detail, the electric characteristic of the threshold switch structure 300 can be influenced by providing a voltage different (V≠0) over the switch element 304 (including the anti-ferroelectric layer 404 and the dielectric layer 408) by the first electrode 302 and the second electrode 306. Due to the polarization of the anti-ferroelectric material 404m of the switch element 304, the Fermi levels of the first electrode 302 and the second electrode 306 and the bandgaps caused by the switch element 304 are different for the two different polarization states 324-1, 324-2. As a result, in the first electrical conductance state 314-1, the switch element 304 and therefore the threshold switch structure 300 has a lower electrical conductivity and a higher electrical resistance compared to the second electrical conductance state 314-2.

Figure 5A:
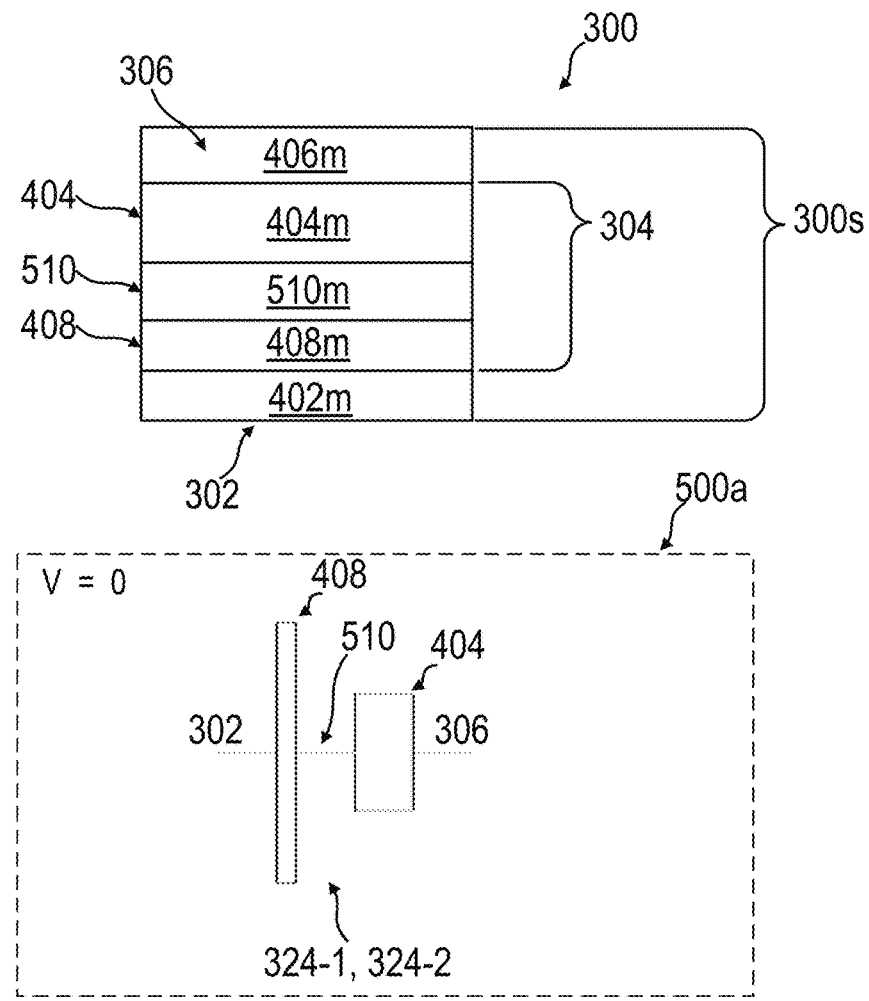
FIG. 5A, FIG. 5B, and FIG. 5C show schematically various aspects of threshold switch structure, according to various aspects.
Figure 5B:
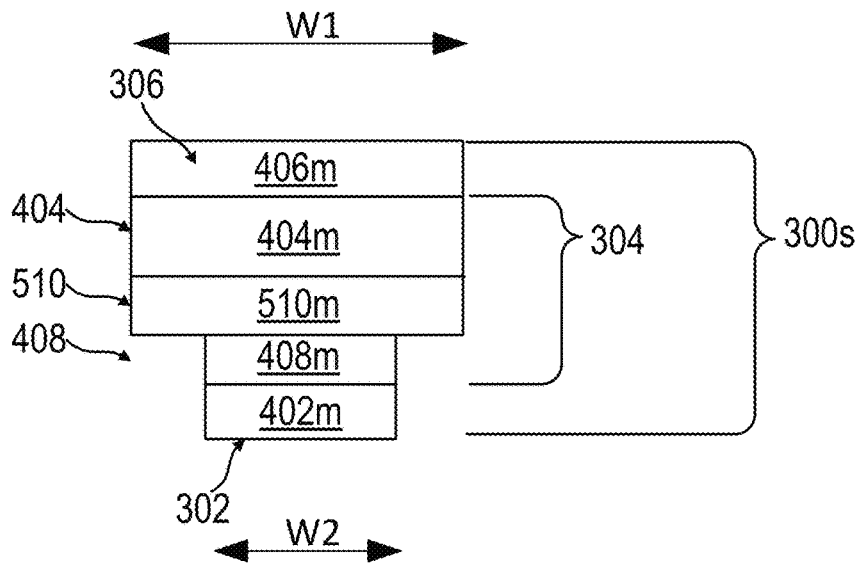

FIG. 5A and FIG. 5B show various aspects of different configurations with respect to the switch element 304 of the threshold switch structure 300.

As illustrated in FIG. 5A, the switch element 304 of the threshold switch structure 300 may include, additionally to the elements described exemplarily in FIG. 4B, an intermediate electrode 510. In other words, an intermediate electrode 510 may be disposed between the first electrode 302 and the second electrode 306 of the threshold switch structure 300. The anti-ferroelectric layer 404 may be disposed between one of the electrodes 302, 306 of the threshold switch structure 300 and the intermediate electrode 510 (e.g., the anti-ferroelectric layer 404 may be disposed between the second electrode 306 and the intermediate electrode 510). One or more dielectric layers (e.g., a dielectric layer 408) may be disposed between another one of the electrodes 302, 306 of the threshold switch structure 300 and the intermediate electrode 510 (e.g., the dielectric layer 408 may be disposed between the first electrode 302 and the intermediate electrode 510). The intermediate electrode 510 may include any suitable electrically conductive material 510m, e.g., the same material as the first electrode 302 and/or the second electrode 306 or a material different from the materials 402m, 406m of the first electrode 302 and second electrode 306 of the threshold switch structure 300.

The intermediate electrode 510 may modify the schematic band diagram 500a in terms of a separation of the bandgap of the anti-ferroelectric layer 404 and the dielectric layer 408 (cf. the schematic band diagrams 400b).

According to various aspects, the use of an intermediate electrode 510 may form illustratively a series connection of a first capacitor formed by the intermediate electrode 510, the anti-ferroelectric layer 404, and the second electrode 306; and a second capacitor formed by the intermediate electrode 510, the dielectric layer 408, and the first electrode 302. The effective capacitor areas of the series connection of such a first capacitor and second capacitor may be adapted, e.g., the effective capacitor area of the first capacitor may be greater than the effective capacitor area of the second capacitor, as exemplarily illustrated in FIG. 5B. Alternatively, the effective capacitor area of the second capacitor may be greater than the effective capacitor area of the first capacitor. In some aspects, the effective capacitor area may be defined as a vertical geometrical projection of the two electrode areas of the respective capacitor on one another. Illustratively, the electrode of the capacitor with the least area may define the effective capacitor area and therefore the capacity of the respective capacitor.

According to various aspects, a total width (W1) of the intermediate electrode 510 may be substantially the same as total width (W1) of the second electrode 306. Furthermore, a total width (W2) of the first electrode 302 may be substantially less than the total width (W1) of the intermediate electrode 510 and the second electrode 306, as illustrated in FIG. 5B. Alternatively, the total width of the intermediate electrode 510 may be substantially the same as the total width of the first electrode 302. Furthermore, the total width of the second electrode 306 may be substantially less than the total width of the intermediate electrode 510 and the first electrode 302 (not illustrated).

FIG. 4B, FIG. 5A, and FIG. 5B show respectively a threshold switch structure 300 in which only single dielectric layer 408 is disposed between the first electrode 302 and the second electrode 306; however, it is noted that instead of a single dielectric layer 408 a plurality of dielectric layers can be disposed between the first electrode 302 and the second electrode 306 as part of the switch element 304 of the threshold switch structure 300. At least two dielectric layers 408 of the plurality of dielectric layers may have a respective bandgap different from one another.

Figure 5C:
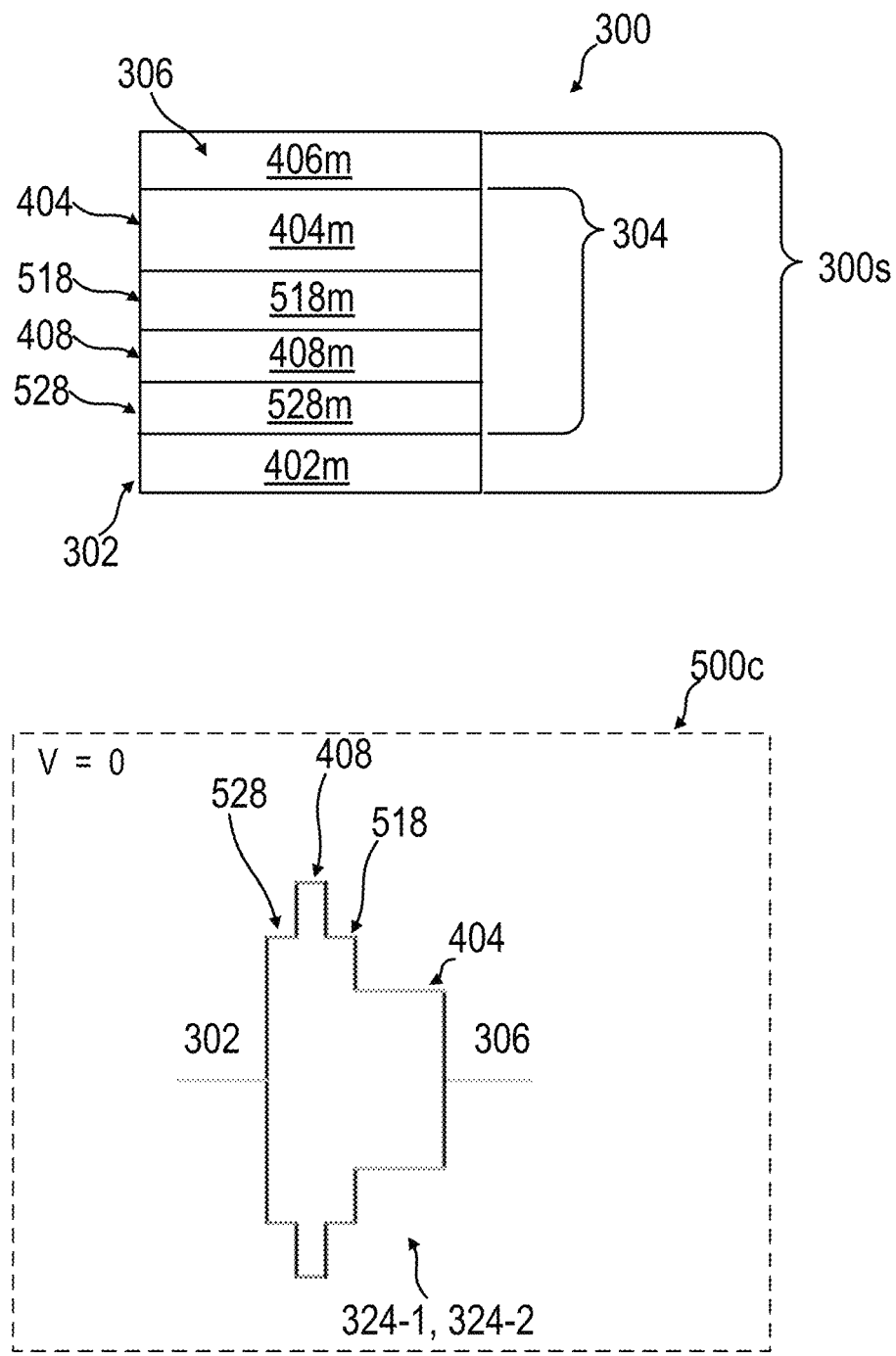

FIG. 5C shows exemplarily a threshold switch structure 300 having a plurality of dielectric layers (e.g., three dielectric layers 408, 518, 528) disposed between the first electrode 302 and the second electrode 306 as part of the switch element 304 of the threshold switch structure 300.

The plurality of dielectric layers (e.g., the three dielectric layers 408, 518, 528) may modify the schematic band diagram 500c in terms of shape of the effective barrier (or bandgap) provided by the dielectric portion of the switch element 304 (cf. the schematic band diagrams 400b).

According to various aspects, a first dielectric layer (e.g., dielectric layer 408) may be disposed between a second dielectric layer (e.g., dielectric layer 518) and a third dielectric layer (e.g., dielectric layer 528). In some aspects, a dielectric material (e.g., dielectric material 408m) of the first dielectric layer may have a greater bandgap than a dielectric material (e.g., dielectric material 518m) of the second dielectric layer. In some aspects, a dielectric material (e.g., dielectric material 408m) of the first dielectric layer may have a greater bandgap than a dielectric material (e.g., dielectric material 528m) of the third dielectric layer. In some aspects, a dielectric material (e.g., dielectric material 408m) of the first dielectric layer may have a greater bandgap than both a dielectric material (e.g., dielectric material 518m) of the second dielectric layer and a dielectric material (e.g., dielectric material 528m) of the third dielectric layer. Therefore, in some aspects, the distinct dielectric materials included in the switch element 304 provide a more effective tunnel barrier.

Various schematic band diagrams 400a, 400b, 500a, 500c are shown illustratively in FIGS. 4A, 4B, 5A, and 5C. It is noted that the schematic band diagrams are illustrated with the Fermi level of the electrodes and the bandgap (represented by an upper line indicating the lower edge of the conduction band and a lower line indicating the upper edge of the valence band) of the switch element, e.g., of the polarizable layer 404 and/or the polarizable material 404m as well as of the dielectric layers 408, 518, 528 and/or the dielectric materials 408m, 518m, 528m.

Figure 6:
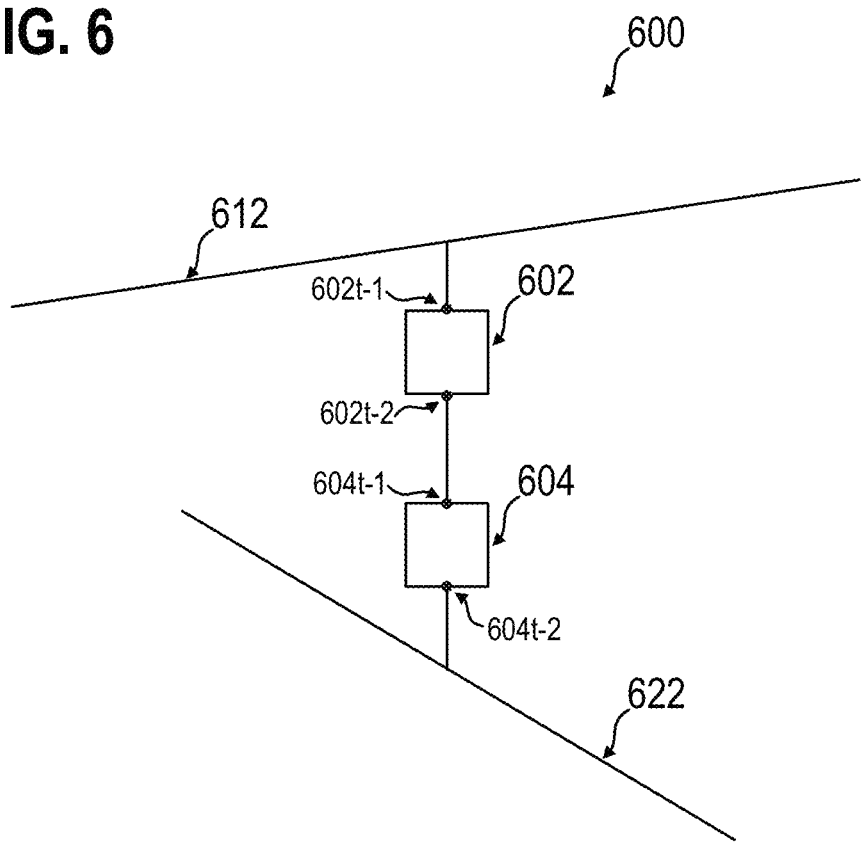
FIG. 6 shows schematically a memory cell arrangement including a threshold switch structure, according to various aspects.

FIG. 6 shows a memory cell arrangement 600 or a part of a memory cell arrangement 600 in a schematic view, according to various aspects. The memory cell arrangement 600 may at least include a memory cell 602 and a set of control lines 612, 622 configured to control an operation (e.g., writing and/or reading) of the memory cell 602. According to various aspects, the memory cell arrangement 600 may further include a threshold switch 604 (e.g., the threshold switch 604 may be a threshold switch structure 300 as described herein) coupled between the memory cell 602 and one control line of the set of control lines 612, 622. The memory cell 602 may be a two-terminal memory cell, wherein a first terminal 602t-1 of the memory cell 602 may be electrically conductively connected to a first control line 612 of the set of control lines 612, 622. A second terminal 602t-2 of the memory cell 602 may be electrically conductively connected to a first terminal 604t-1 of the threshold switch 604. A second terminal 604t-2 of the threshold switch 604 may be electrically conductively connected to a second control line 622 of the set of control lines 612, 622.

According to various aspects, the threshold switch 604 of the memory cell arrangement 600 may be configured as a two-terminal device, wherein a first electrode (e.g., first electrode 302) of the threshold switch 604 may be the first terminal 604t-1 of the threshold switch 604 or may be electrically conductively connected to the first terminal 604t-1 of the threshold switch 604 and wherein the second electrode (e.g., second electrode 306) of the threshold switch 604 may be the second terminal 604t-2 of the threshold switch 604 or may be electrically conductively connected to the second terminal 604t-2 of the threshold switch 604.

According to various aspects, a memory cell arrangement may include one or more memory cells 602; a set of control lines 612, 622 configured to control one or more operations (e.g., writing and/or reading) of the one or more memory cells 602; and, for each respective memory cell 602 of the one or more memory cells 602, a threshold switch 604 coupled between a control line 622 of the set of control lines 612, 622 and the respective memory cell 602. The threshold switch 604 may include (see the aspects described with reference to the threshold switch structure 300): a first electrode 302 electrically connected the control line 622, a second electrode 306 electrically connected to the respective memory cell 602, and a switch element 304 in direct physical contact with the first electrode 302 and the second electrode 306, the switch element including a layer of a polarizable material 404m (e.g., the anti-ferroelectric layer 404). The first electrode 302, the second electrode 306, and the switch element 304 are configured to allow for a switching of the switch element 304 between a first electrical conductance state 314-1 and a second electrical conductance state 314-2 as a function of a voltage drop provided over the switch element 304 by the first electrode 302 and the second electrode 306.

Figure 7:
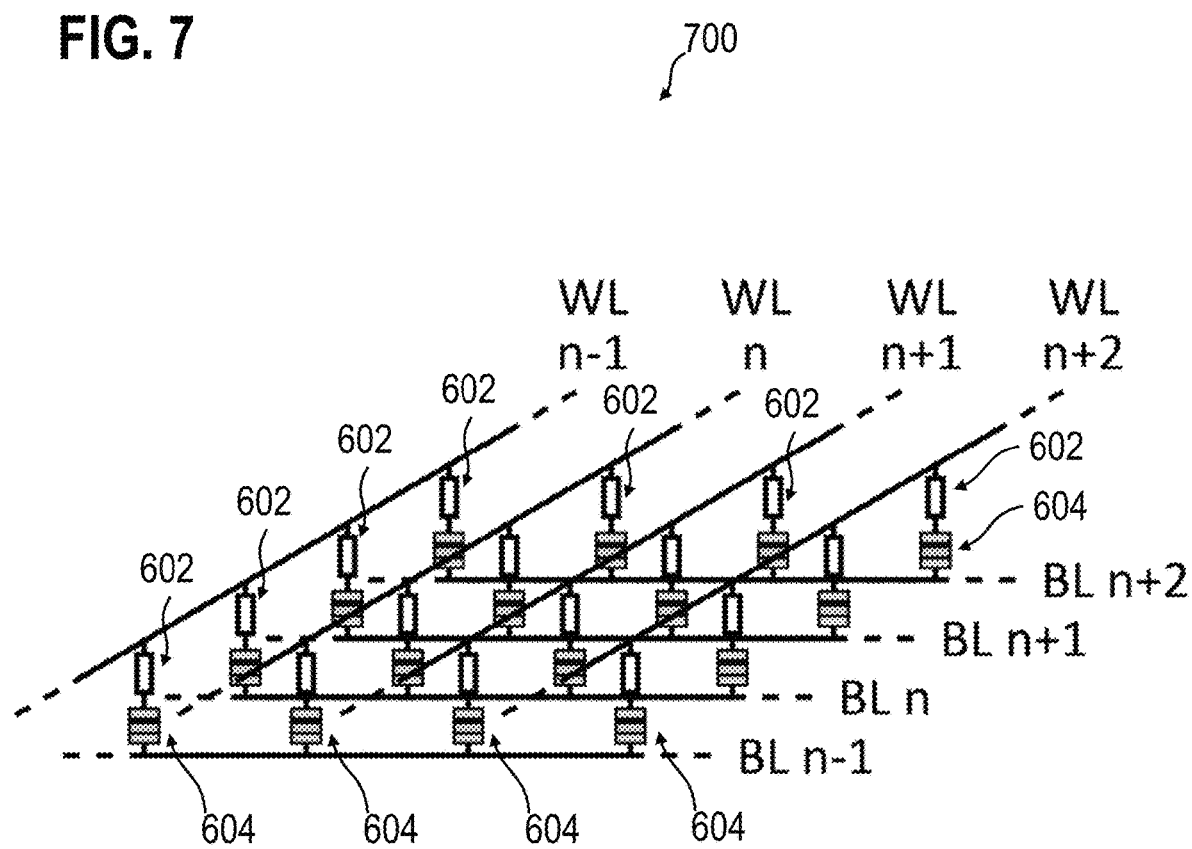
FIG. 7 shows schematically a memory cell arrangement including a set of threshold switch structures, according to various aspects.

FIG. 7 shows a memory cell arrangement 700 or a part of a memory cell arrangement 700 in a schematic view, according to various aspects. The memory cell arrangement 700 may have a crossbar configuration, wherein a series connection of a memory cell 602 and a threshold switch 604 is provided in each intersection region in which a control line of a first set of control lines WL(n) crosses a control line of a second set of control lines BL(n). The memory cell 602 and the threshold switch 604 may be configured as described with reference to FIG. 6, wherein each control line of the first set of control lines WL(n) is configured similarly to the first control line 612 and each control line of the second set of control lines BL(n) is configured similarly to the second control line 612.

According to various aspects, a memory cell arrangement may include a plurality of memory cells 602; a set of control lines WL(n), BL(n) configured to control one or more operations (e.g., writing and/or reading) of the plurality of memory cells; and, for each respective memory cell of the plurality of memory cells, a threshold switch 604 coupled between a control line BL(n) of the set of control lines WL(n), BL(n) and the respective memory cell 602. The threshold switch 604 may include (see the aspects described with reference to the threshold switch structure 300): a first electrode 302 electrically connected the control line BL(n), a second electrode 306 electrically connected to the respective memory cell 602, and a switch element 304 in direct physical contact with the first electrode 302 and the second electrode 306, the switch element including a layer of a polarizable material 404m (e.g., the anti-ferroelectric layer 404). The first electrode 302, the second electrode 306, and the switch element 304 are configured to allow for a switching of the switch element 304 between a first electrical conductance state 314-1 and a second electrical conductance state 314-2 as a function of a voltage drop provided over the switch element 304 by the first electrode 302 and the second electrode 306.

According to various aspects, a voltage generated by a corresponding pair of control lines WL(n), BL(n) for the series connection of the memory cell 602 and the corresponding threshold switch 604 may partially drop over the memory cell 602 and over the threshold switch 604. According to various aspects, the memory cell 602 of the memory cell arrangement 600, 700 may be a resistive memory cell. However, a current flow through the resistive memory cell 602 may be controlled by the threshold switch 604. In the case that a voltage drop over the threshold switch 604 and therefore over the switch element 304 of the threshold switch 604 is too low, e.g., below a threshold voltage (e.g., below threshold voltage $V_{S-1}$ or below $V_{S-2}$), no substantive current may flow through the series connection of the memory cell 602 and the threshold switch 604. This may allow for protecting the memory cell 602 from undesired current driven operations by selecting the voltages provided by the control lines accordingly. However, in the case that a voltage drop over the threshold switch 604 and therefore over the switch element 304 of the threshold switch 604 is at or above a threshold voltage (e.g., above threshold voltage $V_{S-1}$ or above threshold voltage $V_{S-2}$), a substantive current may flow through the series connection of the memory cell 602 and the threshold switch 604. This may allow for operating the memory cell 602 by desired current driven operations by selecting the voltages provided by the control lines accordingly.

Illustratively, a voltage to operate a memory cell of the memory cell arrangement may be generated by a corresponding pair of control lines to address the memory cell 602 to be operated. However, this may result in a partial voltage drop across other memory cells of the memory cell arrangement (e.g., a disturb voltage) not to be operated. Therefore, for unwanted voltages that are below the threshold voltage of the threshold switch a current flow through the memory cells not to be operated can be prevented by the serially connected threshold switches.

According to various aspects, the series connection of each of the memory cells with a corresponding threshold switch may allow for an addressing of a respective memory cell by generating a voltage to drop over the respective series connection that causes a substantial current flow through the series connection (e.g., sufficient to operate the memory cell). However, undesired currents through series connections associated with memory cells not to be operated can be prevented by the respective threshold switch. Illustratively, lower voltage drops over unselected memory cells (not to be written/read) during operation of the memory cell arrangement may cause not currents in such unselected memory cells.

According to various aspects, each respective memory cell 602 of the memory cell arrangement 600, 700 may be a resistive memory cell and the threshold switch 604 may be configured to reduce a disturb current flow through the respective memory cell 602 during operating (e.g., writing and/or reading) of one or more other memory cells of the memory cell arrangement 600, 700. According to various aspects, the threshold switch 604 may be further configured to allow for providing a current flow through the respective memory cell 602 during operating (e.g., writing and/or reading) the respective memory cell 602.

According to various aspects, the threshold switch 604 (or the threshold switch structure 300) may be used as a selector element in a memory cell arrangement corresponding to one or more memory cells of the memory cell arrangement.

Figure 8:
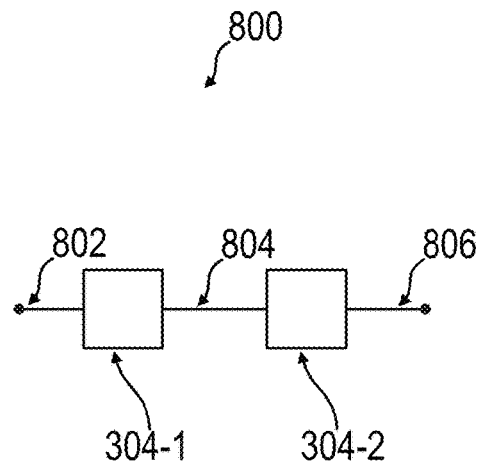
FIG. 8 shows schematically a resonant configuration of two threshold switch elements, according to various aspects.

FIG. 8 shows a resonant arrangement of two threshold switch structures, according to various aspects. Each of the two threshold switch structures is configured, for example, as an anti-ferroelectric junction (e.g., based on charge carrier tunneling, charge carrier emission, charge carrier injection, as examples) and the two anti-ferroelectric junctions separated by a metal layer. The metal layer may be configured to allow for a generation of discrete energy levels in the resonant arrangement of two threshold switch structures. The metal layer may have a layer thickness less than about 5 nm, e.g., 4 nm, 3 nm, or 2 nm, to allow for a generation of discrete energy levels in the resonant arrangement of two threshold switch structures. The Fermi level of the metal that provided the metal layer may be selected in a way to have a two-barrier configuration that may enhance the selectivity of the threshold switch between the total on- and off-state of the resonant arrangement. In some aspects, the metal layer may be an additional electrode that connects one of the electrodes of the threshold switch structure with one of the electrodes of the other threshold switch structure of the resonant arrangement. In other aspects, the two threshold switch structures may share a common electrode, the common electrode providing one of the electrodes of the threshold switch structure and one of the electrodes of the other threshold switch structure.

According to various aspects, as illustrated in FIG. 8, a resonant threshold switch structure 800 may include a first electrode 802, a second electrode 804, and a third electrode 806. The resonant threshold switch structure 800 may further include a first switch element 304-1 in direct physical contact with the first electrode 802 and the second electrode 804, the first switch element 304-1 may include a spontaneously polarizable layer having substantially no remanence in the polarization as described herein. The resonant threshold switch structure 800 may further include a second switch element 304-2 in direct physical contact with the second electrode 804 and the third electrode 806, the second switch element 304-2 may include a spontaneously polarizable layer having substantially no remanence in the polarization. According to various aspects, the first electrode 802, the second electrode 804, the third electrode 806, the first switch element 304-1, and the second switch element 304-2 may be configured to allow for a switching of the resonant threshold switch structure 800 between a first electrical conductance state and a second electrical conductance state as a function of a voltage drop provided over the resonant threshold switch structure 800 by the first electrode 802 and the third electrode 806.

In the following, various examples and aspects are described that may include one or more aspects described above with reference to the threshold switch structure 300 and the memory cell arrangement 600, 700.

Various aspects are related to an anti-ferroelectric material and/or an anti-ferroelectric layer. According to various aspects, the anti-ferroelectric material and/or the anti-ferroelectric layer may be or may include $HfO_2$ and/or $ZrO_2$. Various aspects are related to a threshold switch structure and/or a threshold switch that is configured as an anti-ferroelectric junction (based on charge carrier tunneling, charge carrier emission, charge carrier injection, as examples) and can be used as a selector for a resistance-based memory cell. In some aspects, a resistance-based memory cell may suffer a so-called sneak-path issue when integrated, for example, in a crossbar array (CBA). Such crossbar array may be desirable because of a low area/volume consumption, but sneak currents may prevent an efficient operation of a CBA that includes a larger numbers of memory cells.

Selector devices may solve or mitigate such a sneak-path problem. Select transistors may be considered as ideal switches but are in common configurations not favorable in terms of space consumption and process integration (e.g., they may cause a lot of additional process steps during manufacture). Another option to address sneak-path issues may be to include diodes in the memory array, which may only allow for a unipolar operation. Commonly known threshold switches may be operated like a bipolar diode with high resistance at low absolute voltages and a low resistance above a certain threshold in absolute voltage.

The threshold switch structure and threshold switch described herein may be used in connection with any type of resistive memory, such as tunnel junctions based on ferroelectric effects, memory cells based on magneto resistive effects, phase-change memory cells, valence-change memory cells, and/or electrochemical migration memory cells. However, the use of a threshold switch structure or threshold switch may be particularly useful in connection with devices that are operated (e.g., switched) by a current flow through the device, i.e., for phase-change, valence-change, and/or electrochemical migration memories. Alternatively, the threshold switch structure and threshold switch described herein may be used in connection with a memory structure 100 or a memory cell 200, as described herein.

According to various aspects, the threshold switch structure and threshold switch described herein may be configured complementary metal oxide semiconductor (CMOS) compatible, e.g., including standard CMOS-materials only and may require no special integration considerations (thermal budget, avoiding diffusion/contamination).

According to various aspects, the threshold switch structure and threshold switch described herein may be a CMOS-compatible selector device based on standard-CMOS compatible electrodes as well as CMOS compatible anti-ferroelectric materials based on, for example, $HfO_2$ and/or $ZrO_2$. $Si:HfO_2$ or $Al:HfO_2$ may be used for an integration of the anti-ferroelectric layer via typical front-end of line (FEOL) integration schemes with temperatures of more than 450° C. (e.g., up to 1000° C. or more) to be withstood by the layer and/or available to crystallize the layer into the right phase.

According to various aspects, $Hf_{1-x}Zr_xO_2$ may be used for typical back-end of line BEOL (or mid-end of line, MEOL) integration schemes with temperatures of less than 450° C. (or temperature in the range from about 450° C. to about 650° C.) to a) be withstood by the film and/or b) available to crystallize the film into the right phase.

According to various aspects, the threshold switch structure and threshold switch described herein may be configured to have an asymmetry (e.g., different work functions and or screening lengths of the electrodes and/or one or more dielectric series layers). The threshold switch structure and threshold switch described may be placed below or above or otherwise electrically in series to the resistive memory element.

According to various aspects, the threshold switch structure and threshold switch described herein may be or may include two metals of different work functions and screening lengths sandwiching a 1 nm to 4 nm thick anti-ferroelectric layer including or consisting of $ZrO_2$ or $Al:HfO_2$ (aluminum doped $HfO_2$) or $Si:HfO_2$ (silicon doped $HfO_2$).

According to various aspects, the threshold switch structure and threshold switch described herein may be or may include two metals sandwiching a 1 nm to 4 nm thick anti-ferroelectric layer including or consisting of $ZrO_2$ or $Al:HfO_2$ or $Si:HfO_2$ and a dielectric series layer of larger bandgap and lower thickness (compared to the anti-ferroelectric layer) as tunnel barrier.

According to various aspects, the threshold switch structure and threshold switch described herein may be or may include an intermediated electrode that may spatially separate the dielectric layer and the anti-ferroelectric layer from one other to allow independent area scaling of the anti-ferroelectric layer and the dielectric series layer.

According to various aspects, the threshold switch structure and threshold switch described herein may be or may include a stack of dielectrics of different bandgaps forming an optimized tunnel barrier instead of a single dielectric layer.

According to various aspects, the threshold switch structure and threshold switch described herein may be or may include a resonant configuration of two anti-ferroelectric junctions (based on charge carrier tunneling, charge carrier emission, charge carrier injection, as examples) separated by a metal layer. The Fermi level of the metal that provided the metal layer may be selected in a way to have a two-barrier configuration that may enhance the selectivity of the threshold switch between the on- and off-state.

According to various aspects, the threshold switch structure and threshold switch described herein may be configured such that a tunnel current through the switch is influenced by the polarization state of the anti-ferroelectric layer. The anti-ferroelectric layer may provide a conduction band upon polarization of the anti-ferroelectric layer, which allows for a substantial current flow through the dielectric layer or through the barrier provided by the different metals of the electrodes as soon as a sufficiently high voltage is applied at the threshold switch structure, e.g., a voltage in the range from about 0.5 V to about 10 V, as example.

According to various aspects, the dielectric layer or the plurality of dielectric layers included in the switch element may have a total thickness (in current transport direction) of less than 5 nm, e.g., less than 4 nm or less than 3 nm. It is noted that the tunnel current may exponentially decrease with an increasing thickness of the dielectric layer coupled in series with the anti-ferroelectric layer between the two electrodes of the threshold switch structure.

In the case that the anti-ferroelectric layer is not polarized, an electron transport mechanism through the anti-ferroelectric layer other than tunneling may be prevented, therefore, no substantive current may flow in the case that a low voltage (e.g., less than 0.5 V) is applied at the electrodes of the threshold switch structure.

Example 1 is a threshold switch structure (or a threshold switch) including: a first electrode, a second electrode, a switch element in direct physical contact with the first electrode and the second electrode, the switch element including a layer of a spontaneously polarizable material (e.g., an anti-ferroelectric material), wherein the first electrode, the second electrode, and the switch element are configured to allow for a switching of the switch element between a first electrical conductance state and a second electrical conductance state as a function of a voltage drop provided over the switch element by the first electrode and the second electrode. Another example 1 is a threshold switch structure (or a threshold switch) including: a first electrode, a switch element disposed over the first electrode, a second electrode disposed over the switch element, wherein the switch element includes a layer of a spontaneously polarizable material (e.g., an anti-ferroelectric material), and wherein the first electrode, the second electrode, and the switch element are configured to allow for a switching of the switch element between a first electrical conductance state and a second electrical conductance state as a function of a voltage drop provided over the switch element by the first electrode and the second electrode. In another Example 1, a memory cell arrangement may include: a plurality of memory cells; a set of control lines coupled to one or more memory cells of the plurality of memory cells to control writing and/or reading of the one or more memory cells; and, for each respective memory cell of the plurality of memory cells, a threshold switch coupled between a control line of the set of control lines and the respective memory cell, the threshold switch comprising: a first electrode electrically connected the control line, a second electrode electrically connected to the respective memory cell, a switch element in direct physical contact with the first electrode and the second electrode, the switch element comprising a functional layer, the functional layer is spontaneously polarizable and has substantially no remanence in the polarization, wherein the first electrode, the second electrode, and the switch element are configured to allow for a switching of the switch element between a first electrical conductance state and a second electrical conductance state as a function of a voltage drop provided over the switch element by the first electrode and the second electrode. According to various aspects, the functional layer of the switch element may include or consist of a spontaneously polarizable material that shows substantially no remanent polarization.

In Example 2, the threshold switch structure according to Example 1 may optionally include that the first electrical conductance state associated with the switch element corresponds to a first polarization state of the spontaneously polarizable material (e.g., the anti-ferroelectric material) of the switch element.

In Example 3, the threshold switch structure according to Example 1 or 2 may optionally include that the second electrical conductance state associated with the switch element corresponds to a second polarization state of the spontaneously polarizable material (e.g., the anti-ferroelectric material).

In Example 4, the threshold switch structure according to any one of Examples 1 to 3 may optionally include that the threshold switch is configured as a two-terminal device having a first terminal coupled to the first electrode and a second terminal coupled to the second electrode.

In Example 5, the threshold switch structure according to any one of Examples 1 to 3 may optionally include that the threshold switch is configured as a two-terminal device, the first electrode being a first terminal of the two-terminal device and the second electrode being a second terminal of the two-terminal device.

In Example 6, the threshold switch structure according to any one of Examples 1 to 5 may optionally include that the layer of the spontaneously polarizable material (e.g., the anti-ferroelectric material) of the switch element is in direct physical contact with one of the first electrode and the second electrode.

In Example 7, the threshold switch structure according to Example 6 may optionally include that the switch element further includes a dielectric layer in direct physical contact with both the layer of the spontaneously polarizable material (e.g., the anti-ferroelectric material) and the other one of the first electrode and the second electrode.

In Example 8, the threshold switch structure according to any one of Examples 1 to 5 may optionally include that the layer of the spontaneously polarizable material (e.g., the anti-ferroelectric material) of the switch element is in direct physical contact with one of the first electrode and the second electrode, and that the switch element further includes a dielectric layer and an intermediate electrode, wherein the intermediate electrode is in direct physical contact with both the layer of the spontaneously polarizable material (e.g., the anti-ferroelectric material) and the dielectric layer and wherein the dielectric layer is in direct physical contact with the other one of the first electrode and the second electrode.

In Example 9, the threshold switch structure according to any one of Examples 1 to 5 may optionally include that the layer of the spontaneously polarizable material (e.g., the anti-ferroelectric material) of the switch element is in direct physical contact with one of the first electrode and the second electrode, and that the switch element further includes an additional layer of layer of an spontaneously polarizable material (e.g., the anti-ferroelectric material) and an intermediate electrode, wherein the intermediate electrode is in direct physical contact with both the layer of the spontaneously polarizable material (e.g., the anti-ferroelectric material) and the additional layer of the spontaneously polarizable material (e.g., the anti-ferroelectric material) and wherein the additional layer of the spontaneously polarizable material (e.g., the anti-ferroelectric material) is in direct physical contact with the other one of the first electrode and the second electrode.

In Example 10, the threshold switch structure according to any one of Examples 1 to 5 may optionally include that the layer of the spontaneously polarizable material (e.g., the anti-ferroelectric material) of the switch element is in direct physical contact with both the first electrode and the second electrode and that the first electrode includes a first electrically conductive material and that the second electrode includes a second electrically conductive material different from the first electrically conductive material.

In Example 11, the threshold switch structure according to Example 10 may optionally include that the first electrically conductive material is a first metal and wherein the second electrically conductive material is a second metal or a semiconductor.

In Example 12, the threshold switch structure according to Example 10 or 11 may optionally include that the first electrically conductive material has a first Debye length and wherein the second electrically conductive material has a second Debye length different from the first Debye length.

In Example 13, the threshold switch structure according to any one of Examples 1 to 12 may optionally include that an area of the first electrode and an area of the second electrode define a capacitive structure having the switch element as a separation structure between the first electrode and the second electrode, and that a size of the area of the first electrode is less than a size of the area of the second electrode.

In Example 14, the threshold switch structure according to any one of Examples 1 to 5 may optionally include that the layer of the spontaneously polarizable material (e.g., the anti-ferroelectric material) of the switch element is in direct physical contact with the first electrode and wherein the switch element further includes a dielectric layer in direct physical contact with both the layer of the spontaneously polarizable material (e.g., the anti-ferroelectric material) and the second electrode, and wherein a size of an area of the first electrode is greater than a size of an area of the second electrode.

In Example 15, the threshold switch structure according to any one of Examples 1 to 5 may optionally include that the layer of the spontaneously polarizable material (e.g., the anti-ferroelectric material) of the switch element is in direct physical contact with the first electrode and that the switch element further includes one or more dielectric layers and an intermediate electrode, wherein the intermediate electrode is in direct physical contact with both the layer of the spontaneously polarizable material (e.g., the anti-ferroelectric material) and one of the one or more dielectric layers, wherein the second electrode is in direct physical contact with one of the one or more dielectric layers, and wherein a size of an area of the first electrode is greater than a size of an area of the second electrode.

In Example 16, the threshold switch structure according to any one of Examples 1 to 15 may optionally include that, in the case that the layer of the spontaneously polarizable material (e.g., the anti-ferroelectric material) of the switch element is in the first electrical conductance state, the layer of the spontaneously polarizable material (e.g., the anti-ferroelectric material) is substantially non-conductive and acts as a charge flow barrier (e.g., a tunnel barrier) between the first electrode and the second electrode.

In Example 17, the threshold switch structure according to any one of Examples 1 to 16 may optionally include that, in the case that the layer of the spontaneously polarizable material (e.g., the anti-ferroelectric material) of the switch element is in the second electrical conductance state, the layer of the spontaneously polarizable material (e.g., the anti-ferroelectric material) is substantially conductive and acts as an electrically connective portion between the first electrode and the second electrode.

In Example 18, the threshold switch structure according to any one of Examples 1 to 5 may optionally include that the layer of the spontaneously polarizable material (e.g., the anti-ferroelectric material) of the switch element is in direct physical contact with one of the first electrode and the second electrode, and that the switch element further includes at least a first dielectric layer in direct physical contact with the layer of the spontaneously polarizable material (e.g., the anti-ferroelectric material) and a second dielectric layer in direct physical contact with both the first dielectric layer and the other one of the first electrode and the second electrode.

In Example 19, the threshold switch structure according to Example 18 may optionally include that the first dielectric layer includes (e.g., consists of) a material having a first bandgap and that the second dielectric layer includes (e.g., consists of) a material having a second bandgap distinct from the first bandgap.

In Example 20, the threshold switch structure according to any one of Examples 1 to 5 may optionally include that the layer of the spontaneously polarizable material (e.g., the anti-ferroelectric material) of the switch element is in direct physical contact with one of the first electrode and the second electrode, and that the switch element further includes at least a first dielectric layer in direct physical contact with the layer of the spontaneously polarizable material (e.g., the anti-ferroelectric material), a second dielectric layer in direct physical contact with the first dielectric layer, and a third dielectric layer in direct physical contact with both the second dielectric layer and the other one of the first electrode and the second electrode.

In Example 21, the threshold switch structure according to Example 20 may optionally include that the first dielectric layer includes a material having a first bandgap, that the second dielectric layer includes a material having a second bandgap, and that the third dielectric layer includes a material having a third bandgap, wherein at least one of the first bandgap, the second bandgap, and the third bandgap is distinct from another one of the first bandgap, the second bandgap, and the third bandgap.

According to various aspects, a dielectric layer as referred to (for example, in Examples 18 to 21) may include one or more materials of the following group of materials: $Al_2O_3$, $SiO_x$ (e.g., $SiO_2$), $Ta_2O_5$, $TaO_x$, $Si_3N_4$, $SiN_x$, $TiO_x$ (e.g., $TiO_2$).

In Example 22, the threshold switch structure according to any one of Examples 1 to 21 may optionally include that the first electrode, the second electrode, and/or the switch element are configured such that a transition from the first electrical conductance state to the second electrical conductance state is caused in the case that the voltage drop exceeds a first threshold voltage drop.

In Example 23, the threshold switch structure according to Example 22 may optionally include that a transition from the first electrical conductance state to the second electrical conductance state includes a change in the differential conductivity and/or differential resistance.

In Example 24, the threshold switch structure according to Example 22 or 23 may optionally include that the first electrode, the second electrode, and/or the switch element are configured such that a transition from the second electrical conductance state to the first electrical conductance state is caused in the case that the voltage drop decreases (e.g., falls below) a second threshold voltage drop different from the first threshold voltage drop.

In Example 25, the threshold switch structure according to any one of Examples 22 to 24 may optionally include that both the first threshold voltage drop, and the second threshold voltage drop are in the range from about 0.5 V to about 10 V or in the range from about −0.5 V to about −10 V.

In Example 26, the threshold switch structure according to any one of Examples 1 to 25 may optionally include that the switch element has a first electrical conductance in the case that the switch element is in the first electrical conductance state and a second electrical conductance greater than the first electrical conductance in the case that the switch element is in the second electrical conductance state.

In Example 27, the threshold switch structure according to any one of Examples 1 to 26 may optionally include that the switch element is in the first electrical conductance state in the case that the voltage drop is zero independently from a previous electrical conductance state the switch element was residing in.

In Example 28, the threshold switch structure according to any one of Examples 1 to 27 may optionally include that the layer of the spontaneously polarizable material (e.g., the anti-ferroelectric material) of the switch element has no residual polarization or substantially no residual polarization (e.g., a residual polarization with an absolute value of less than about 3 $\mu C/cm^2$, e.g., less than about 2 $\mu C/cm^2$, e.g., less than about 1 $\mu C/cm^2$, e.g., about 0 $\mu C/cm^2$) in the case that the voltage drop is zero (referred to as remanent polarization) independently from a previous electrical conductance state the switch element was residing in.

In Example 29, the threshold switch structure according to any one of Examples 1 to 28 may optionally include that layer of the spontaneously polarizable material (e.g., the anti-ferroelectric material) is a layer including hafnium oxide and/or zirconium oxide, e.g., doped hafnium oxide (e.g., silicon doped hafnium oxide, e.g., aluminum doped hafnium oxide), e.g., doped zirconium oxide, e.g., a mixture of hafnium oxide and zirconium oxide.

Example 30 is a memory cell arrangement including: a plurality of memory cells; a set of control lines coupled to one or more memory cells of the plurality of memory cells to control writing and/or reading of the one or more memory cells; and, for each respective memory cell of the plurality of memory cells, a threshold switch coupled between a control line of the set of control lines and the respective memory cell, the threshold switch including: a first electrode electrically connected the control line, a second electrode electrically connected to the respective memory cell, a switch element in direct physical contact with the first electrode and the second electrode, the switch element including a layer of a polarizable material, wherein the first electrode, the second electrode, and the switch element are configured to allow for a switching of the switch element between a first electrical conductance state and a second electrical conductance state as a function of a voltage drop provided over the switch element by the first electrode and the second electrode.

In Example 31, the memory cell arrangement of Example 30 may optionally further include that the threshold switch is configured in accordance with any one of Examples 1 to 29.

In Example 32, the memory cell arrangement of Example 30 or 31 may optionally further include that each respective memory cell of the plurality of memory cells is a resistive memory cell and wherein the threshold switch is configured to reduce a disturb current flow through the respective memory cell during operating (e.g., writing and/or reading) of one or more other memory cells of the plurality of memory cells. According to various aspects, a resistive memory cell may be configured such that applying a write voltage changes at least temporarily (remanently or volatile) the electrical resistance of the resistive memory cell.

In Example 33, the memory cell arrangement of any one of Examples 30 to 32 may optionally further include that the threshold switch is further configured to allow for providing a current flow through the respective memory cell during operating (e.g., writing and/or reading) of the respective memory cell.

Example 34 is a (e.g., resonant) threshold switch structure arrangement including: a first threshold switch structure according to any one of Examples 1 to 29; a second threshold switch structure according to any one of claims Examples 1 to 29; wherein the first electrode or the second electrode of the first threshold switch structure is electrically connected or a common electrode with the first electrode or the second electrode of the second threshold switch structure.

Example 35 is a (e.g., resonant) threshold switch structure arrangement including: a series connection of a first anti-ferroelectric junction and a second anti-ferroelectric junction, wherein a metal layer is disposed in between an anti-ferroelectric layer of the first anti-ferroelectric junction and an anti-ferroelectric layer of the second anti-ferroelectric junction, and a first electrode and a second electrode, wherein the anti-ferroelectric layer of the first anti-ferroelectric junction is disposed between the first electrode and the metal layer and wherein the anti-ferroelectric layer of the second anti-ferroelectric junction is disposed between the second electrode and the metal layer.

Example 36 is a threshold switch structure including: a first electrode; a second electrode; a third electrode; a first switch element in direct physical contact with the first electrode and the second electrode, the first switch element comprising a spontaneously polarizable layer having substantially no remanence in the polarization; and a second switch element in direct physical contact with the second electrode and the third electrode, the second switch element comprising a spontaneously polarizable layer having substantially no remanence in the polarization, wherein the first electrode, the second electrode, the third electrode, the first switch element, and the second switch element are configured to allow for a switching of the threshold switch structure between a first electrical conductance state and a second electrical conductance state as a function of a voltage drop provided over the threshold switch structure by the first electrode and the third electrode.

Various aspects are described with reference to a tunnel current; however, it is noted that any suitable electric conduction mechanisms may be considered, such as Poole-Frenkel conduction, Schottky emission, trap-assisted-tunneling, direct tunneling, Fowler-Nordheim tunneling, as examples.

According to various aspects, a size of an electrode, as referred to herein, may be determined as a size of the cross-sectional area perpendicular to the direction of the current flow through the respective electrode.

According to various aspects, a threshold switch structure, as referred to herein, may include solely a threshold switch. In other aspects, a threshold switch structure, as referred to herein, may include a threshold switch and one or more electronic elements (e.g., a memory cell) connected (e.g., in a series connection) to the threshold switch.

The terms "at least one" and "one or more" may be understood to include any integer number greater than or equal to one, i.e., one, two, three, four, [ . . . ], etc. The term "a plurality" or "a multiplicity" may be understood to include any integer number greater than or equal to two, i.e., two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g., a layer "over" a side or surface, may be used to mean that the feature, e.g., the layer, may be formed "directly on", e.g., in direct contact with, the implied side or surface. The word "over", used herein to describe forming a feature, e.g., a layer "over" a side or surface, may be used to mean that the feature, e.g., the layer, may be formed "indirectly on" the implied side or surface with one or more additional layers being arranged between the implied side or surface and the formed layer.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g., parallel to the main processing surface) the "thickness" of the layer formed on the surface of the support may be the same as the height of the layer.

The expression "a material of a layer" or "a material of a portion", for example "a material of an electrode layer" or "a material of a memory portion", may be used herein to describe a main component of that layer or portion, e.g., a main material (for example, a main element or a main compound) present in that layer or portion. The term "a material of a layer" or "a material of a portion" may describe, in some aspects, the material of that layer or portion having a weight percentage greater than 60% over the total weight of the materials that the layer or portion includes. The term "a material of a layer" or "a material of a portion" may describe, in some aspects, the material of that layer or portion having a volume percentage greater than 60% over the total volume of the materials that the layer or portion includes. As an example, a material of a layer or portion including aluminum may describe that that layer or portion is formed mostly by aluminum, and that other elements (e.g., impurities) may be present in a smaller proportion, e.g., having less weight percentage or less volume percentage compared to aluminum. As another example, a material of a layer or portion including titanium nitride may describe that that layer or portion is formed mostly by titanium nitride, and that other elements (e.g., impurities) may be present in a smaller proportion, e.g., having less weight percentage or less volume percentage compared to titanium nitride.

According to various aspects, the properties and/or the structure of an electrode, an electrode layer, a dielectric layer, and/or an anti-ferroelectric layer as described herein may be evaluated with techniques known in the art. As an example, transmission electron microscopy (TEM) may be used to determine the structure of a material or a layer, for example the presence of one or more sub-layers in a layer. TEM may be used for identifying a layer, an interface, a crystal structure, a microstructure, chemical composition and/other properties. According to various aspects, electron diffraction may be used in combination with the TEM to characterize a structure, such as the threshold switch structure. As another example, X-ray crystallography (X-ray diffraction) may be used to determine various properties of a layer or a material, such as the crystal structure, the lattice properties, the size and shape of a unit cell, the chemical composition, the phase or alteration of the phase, the presence of stress in the crystal structure, the microstructure, and the like. As a further example, electron backscatter diffraction (EBSD) or transmission Kikuchi diffraction (TKD) may be used to determine various properties of a layer or a material, such as crystal orientation (e.g., to determine a crystallographic texture), one or more phases, a strain, etc. As a further example, energy-dispersive X-ray spectroscopy (EDS) may be used to determine the chemical composition of a layer or a material, e.g., the presence and/or the content of an element in the layer or material. As a further example, x-ray photoelectron spectroscopy (XPS) may be used to determine the chemical composition of a layer or a material, e.g., the presence and/or the content of an element in the layer or material. As a further example, Rutherford backscattering spectrometry (RBS) may be used to determine the structure and/or the composition of a material. As a further example, secondary ion mass spectrometry (SIMS) may be used to analyze the molecular composition of the upper monolayers of a solid, e.g., for analyzing the spatial distribution (e.g., the gradient) of an element across the solid. As a further example, neutron diffraction (also referred to as elastic neutron scattering) may be used to determine the atomic structure of a material.

According to various aspects, a functional layer of a switch or another electronic element may include or may be made of a polarizable material, e.g., a spontaneously polarizable material (such as an anti-ferroelectric, as example). An anti-ferroelectric material may show a hysteresis in the (voltage dependent) polarization, however, with no remanent polarization remaining in the case that no voltage drops over the anti-ferroelectric material. A ferroelectric material, in contrast, may show a hysteresis in the (voltage dependent) polarization, however, with a remanent polarization remaining in the case that no voltage drops over the ferroelectric material. A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity measurements, e.g., via a static (C-V) and/or time-resolved measurement or by polarization-voltage (P-V) or positive-up-negative-down (PUND) measurements.

The term "spontaneously polarizable material" or "spontaneous-polarizable material" may be used herein with reference to a material that has a polarization capability in addition to its dielectric polarization capability. A spontaneously-polarizable material may be or may include a spontaneously-polarizable material that shows a remanence, e.g., a ferroelectric material, and/or a spontaneously-polarizable material that shows no remanence, e.g., an anti-ferroelectric material.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell arrangement comprising:
   a plurality of memory cells;
   a set of control lines coupled to one or more memory cells of the plurality of memory cells to control writing and/or reading of the one or more memory cells; and,
   for each respective memory cell of the plurality of memory cells, a threshold switch coupled between a control line of the set of control lines and the respective memory cell, the threshold switch comprising:
   a first electrode electrically connected the control line,
   a second electrode electrically connected to the respective memory cell,
   a switch element in direct physical contact with the first electrode and the second electrode, the switch element comprising a layer of a spontaneously polarizable material,
   wherein the first electrode, the second electrode, and the switch element are configured to allow for a switching of the switch element between a first electrical conductance state and a second electrical conductance state as a function of a voltage drop provided over the switch element by the first electrode and the second electrode,
   wherein the first electrical conductance state associated with the switch element corresponds to a first polarization state of the spontaneously polarizable material of the switch element, and
   wherein the second electrical conductance state associated with the switch element corresponds to a second polarization state of the spontaneously polarizable material.

2. The memory cell arrangement according to claim 1, wherein the memory cells of the plurality of memory cells are resistive memory cells.

3. The memory cell arrangement according to claim 2, wherein threshold switch is configured to reduce a disturb current flow through the respective memory cell during operating of one or more other memory cells of the plurality of memory cells.

4. The memory cell arrangement according to claim 3, wherein the threshold switch is further configured to allow for providing a current flow through the respective memory cell during operating of the respective memory cell.

5. The memory cell arrangement according to claim 1, wherein, in the case that the layer of the spontaneously polarizable material of the switch element is in the first electrical conductance state, the layer of the spontaneously polarizable material is substantially non-conductive and acts as a barrier between the first electrode and the second electrode; and
wherein, in the case that the layer of the spontaneously polarizable material of the switch element is in the second electrical conductance state, the layer of the spontaneously polarizable material is substantially conductive and acts as an electrically connective portion between the first electrode and the second electrode.

6. The memory cell arrangement according to claim 1, wherein a transition from the first electrical conductance state to the second electrical conductance state is associated with a change in the differential conductivity and/or the differential resistance of the switch element.

7. The memory cell arrangement according to claim 1, wherein the first electrode, the second electrode, and/or the switch element are configured such that a transition from the first electrical conductance state to the second electrical conductance state is caused in the case that the voltage drop exceeds a first threshold voltage drop.

8. The memory cell arrangement according to claim 7, wherein the first electrode, the second electrode, and/or the switch element are configured such that a transition from the second electrical conductance state to the first electrical conductance state is caused in the case that the voltage drop deceeds a second threshold voltage drop different from the first threshold voltage drop.

9. The memory cell arrangement according to claim 1, wherein the switch element has a first electrical conductance in the case that the switch element is in the first electrical conductance state and a second electrical conductance greater than the first electrical conductance in the case that the switch element is in the second electrical conductance state, and
wherein the switch element is in the first electrical conductance state in the case that the voltage drop is zero independently from a previous electrical conductance state the switch element was residing in.

10. The memory cell arrangement according to claim 1, wherein the layer of the spontaneously polarizable material of the switch element has substantially no residual polarization in the case that the voltage drop is zero independently from a previous electrical conductance state of the switch element.

11. The memory cell arrangement according to claim 1, wherein the layer of the spontaneously polarizable material of the switch element is in direct physical contact with one of the first electrode and the second electrode.

12. The memory cell arrangement according to claim 1, wherein the switch element further comprises one or more dielectric layers disposed between the layer of the spontaneously polarizable material and one of the first electrode and the second electrode.

13. The memory cell arrangement according to claim 1, wherein the switch element further comprises an intermediate electrode disposed between the layer of the spontaneously polarizable material and one of the first electrode and the second electrode.

14. The memory cell arrangement according to claim 1, wherein the layer of the spontaneously polarizable material of the switch element is in direct physical contact with both the first electrode and the second electrode and wherein the first electrode comprises a first electrically conductive material and wherein the second electrode comprises a second electrically conductive material different from the first electrically conductive material.

15. The memory cell arrangement according to claim 14, wherein the first electrically conductive material has a first Debye length and wherein the second electrically conductive material has a second Debye length different from the first Debye length.

16. The memory cell arrangement according to claim 1, wherein the layer of the spontaneously polarizable material of the switch element is in direct physical contact with one of the first electrode and the second electrode, and
wherein the switch element further comprises at least a first dielectric layer and a second dielectric layer disposed between the layer of the spontaneously polarizable material and the other one of the first electrode and the second electrode,
wherein the first dielectric layer comprises a material having a first bandgap and wherein the second dielectric layer comprises a material having a second bandgap distinct from the first bandgap.

17. The memory cell arrangement according to claim 1, wherein the switch element further comprises an intermediate electrode and an additional layer of a spontaneously polarizable material, wherein the layer of the spontaneously polarizable material is disposed between the intermediate electrode and one of the first electrode and the second electrode, and wherein the additional layer of the spontaneously polarizable material is disposed between the intermediate electrode and the other one of the first electrode and the second electrode.

18. A threshold switch structure comprising:
a first electrode;
a second electrode; and
a switch element in direct physical contact with the first electrode and the second electrode, the switch element comprising a spontaneously polarizable layer having no or substantially no remanence in the polarization,
wherein the first electrode, the second electrode, and the switch element are configured to allow for a switching of the switch element between a first electrical conductance state and a second electrical conductance state as a function of a voltage drop provided over the switch element by the first electrode and the second electrode,
wherein the first electrical conductance state associated with the switch element corresponds to a first polarization state of the spontaneously polarizable material of the switch element, and
wherein the second electrical conductance state associated with the switch element corresponds to a second polarization state of the spontaneously polarizable material.

19. A threshold switch structure comprising:
a first electrode;
a second electrode;
a third electrode;
a first switch element in direct physical contact with the first electrode and the second electrode, the first switch element comprising a spontaneously polarizable layer having substantially no remanence in the polarization; and
a second switch element in direct physical contact with the second electrode and the third electrode, the second switch element comprising a spontaneously polarizable layer having substantially no remanence in the polarization,
wherein the first electrode, the second electrode, the third electrode, the first switch element, and the second switch element are configured to allow for a switching of the threshold switch structure between a first electrical conductance state and a second electrical conductance state as a function of a voltage drop provided over the threshold switch structure by the first electrode and the third electrode.

20. A memory cell arrangement comprising:
a plurality of memory cells;
a set of control lines coupled to one or more memory cells of the plurality of memory cells to control writing and/or reading of the one or more memory cells; and,
for each respective memory cell of the plurality of memory cells, a threshold switch coupled between a control line of the set of control lines and the respective memory cell, the threshold switch comprising:

a first electrode electrically connected the control line, a second electrode electrically connected to the respective memory cell, a switch element in direct physical contact with the first electrode and the second electrode, the switch element comprising a layer of a spontaneously polarizable material, wherein the first electrode, the second electrode, and the switch element are configured to allow for a switching of the switch element between a first electrical conductance state and a second electrical conductance state as a function of a voltage drop provided over the switch element by the first electrode and the second electrode, wherein the first electrode, the second electrode, and/or the switch element are configured such that a transition from the first electrical conductance state to the second electrical conductance state is caused in the case that the voltage drop exceeds a first threshold voltage drop.

21. A memory cell arrangement comprising:

a plurality of memory cells;

a set of control lines coupled to one or more memory cells of the plurality of memory cells to control writing and/or reading of the one or more memory cells; and, for each respective memory cell of the plurality of memory cells, a threshold switch coupled between a control line of the set of control lines and the respective memory cell, the threshold switch comprising:

a first electrode electrically connected the control line, a second electrode electrically connected to the respective memory cell, a switch element in direct physical contact with the first electrode and the second electrode, the switch element comprising a layer of a spontaneously polarizable material, wherein the first electrode, the second electrode, and the switch element are configured to allow for a switching of the switch element between a first electrical conductance state and a second electrical conductance state as a function of a voltage drop provided over the switch element by the first electrode and the second electrode, wherein the layer of the spontaneously polarizable material of the switch element is in direct physical contact with both the first electrode and the second electrode and wherein the first electrode comprises a first electrically conductive material and wherein the second electrode comprises a second electrically conductive material different from the first electrically conductive material.

* * * * *